United States Patent
Babitch et al.

(10) Patent No.: US 7,929,928 B2
(45) Date of Patent: Apr. 19, 2011

(54) FREQUENCY PHASE CORRECTION SYSTEM

(75) Inventors: Daniel Babitch, San Jose, CA (US); Steven A. Gronemeyer, Cedar Rapids, IA (US); Lionel Garin, San Jose, CA (US); Ashutosh Pande, San Jose, CA (US); Leon Kuo-Liang Peng, Mountain View, CA (US); Gengsheng Zhang, Cupertino, CA (US); Nicolas Patrick Vantalon, Sunnyvale, CA (US)

(73) Assignee: SiRF Technology Inc., San Jose, CA (US)

(*) Notice: Subject to any disclaimer, the term of this patent is extended or adjusted under 35 U.S.C. 154(b) by 1265 days.

(21) Appl. No.: 10/997,797

(22) Filed: Nov. 24, 2004

(65) Prior Publication Data

US 2005/0162306 A1 Jul. 28, 2005

Related U.S. Application Data

(63) Continuation-in-part of application No. 10/885,507, filed on Jul. 3, 2004, which is a continuation-in-part of application No. PCT/US03/16308, filed on May 22, 2003, which is a continuation-in-part of application No. 10/155,614, filed on May 22, 2002, now Pat. No. 6,684,158, which is a continuation-in-part of application No. 09/795,871, filed on Feb. 28, 2001, now Pat. No. 6,427,120, application No. 10/997,797, which is a continuation-in-part of application No. 10/385,198, filed on Mar. 10, 2003, now Pat. No. 6,915,208, which is a continuation of application No. 10/127,229, filed on Apr. 19, 2002, now Pat. No. 6,542,823, application No. 10/997,797, which is a continuation of application No. 09/795,871, filed on Feb. 28, 2001, now Pat. No. 6,427,120, which is a continuation-in-part of application No. 10/194,627, filed on Jul. 12, 2002, now Pat. No. 7,577,448, application No. 10/997,797, which is a continuation of application No. 10/068,751, filed on Feb. 5, 2002, now Pat. No. 6,519,466, which is a continuation of application No. 09/781,068, filed on Feb. 8, 2001, now Pat. No. 6,389,291, and a continuation-in-part of application No. 10/700,821, filed on Nov. 4, 2003, now Pat. No. 7,263,440, which is a continuation-in-part of application No. 09/575,492, filed on May 18, 2000, now Pat. No. 6,671,620, application No. 10/997,797, which is a continuation-in-part of application No. 10/759,677, filed on Jan. 18, 2004, now Pat. No. 7,190,307, which is a continuation-in-part of application No. 10/017,115, filed on Dec. 13, 2001, now Pat. No. 6,778,136.

(60) Provisional application No. 60/225,076, filed on Aug. 14, 2000.

(51) Int. Cl.
*H04B 17/02* (2006.01)

(52) U.S. Cl. .............. 455/139; 455/182.1; 455/192.1; 455/255; 455/71; 455/456.1; 375/226; 375/326; 375/327; 375/344; 331/16; 331/18

(58) Field of Classification Search .......... 455/118, 455/119, 151.1, 151.3, 264, 245.1, 255, 258, 455/76, 164.1, 181.1, 196.1, 259, 260, 265, 455/456.3, 456.1, 67.11, 67.13, 139, 147, 455/192.1–192.3, 182.1–182.3, 71; 375/57.74, 375/376, 344, 340, 355, 326, 260, 145, 333, 375/375, 226, 327; 331/57.74, 16, 18; 701/216, 701/213; 342/357.15, 357.1, 357.09, 357.06

See application file for complete search history.

(56) References Cited

U.S. PATENT DOCUMENTS

| 4,426,712 | A | 1/1984 | Gorski-Popiel |

U.S. PATENT DOCUMENTS

| 4,445,118 | A | 4/1984 | Taylor et al. |
| 4,463,357 | A | 7/1984 | MacDoran |
| 4,578,678 | A | 3/1986 | Hurd |
| 4,667,203 | A | 5/1987 | Counselman, III |
| 4,701,934 | A | 10/1987 | Jasper |
| 4,754,465 | A | 6/1988 | Trimble |
| 4,785,463 | A | 11/1988 | Janc et al. |
| 4,809,005 | A | 2/1989 | Counselman, III |
| 4,821,294 | A | 4/1989 | Thomas, Jr. |
| 4,890,233 | A | 12/1989 | Ando et al. |
| 4,894,662 | A | 1/1990 | Counselman |
| 4,998,111 | A | 3/1991 | Ma et al. |

| | | | |
|---|---|---|---|
| 5,014,066 A | 5/1991 | Counselman, III | |
| 5,036,329 A | 7/1991 | Ando | |
| 5,043,736 A * | 8/1991 | Darnell et al. ............. 342/357.1 | |
| 5,108,334 A | 4/1992 | Eschenbach et al. | |
| 5,177,490 A | 1/1993 | Ando et al. | |
| 5,202,829 A | 4/1993 | Geier | |
| 5,223,844 A | 6/1993 | Mansell et al. | |
| 5,225,842 A | 7/1993 | Brown et al. | |
| 5,257,195 A | 10/1993 | Hirata | |
| 5,293,170 A | 3/1994 | Lorenz et al. | |
| 5,311,195 A | 5/1994 | Mathis et al. | |
| 5,323,164 A | 6/1994 | Endo | |
| 5,343,209 A | 8/1994 | Sennott et al. | |
| 5,345,244 A | 9/1994 | Gildea et al. | |
| 5,347,284 A | 9/1994 | Volpi et al. | |
| 5,347,536 A | 9/1994 | Meehan | |
| 5,365,450 A | 11/1994 | Schuchman et al. | |
| 5,379,224 A | 1/1995 | Brown et al. | |
| 5,402,347 A | 3/1995 | McBurney et al. | |
| 5,402,441 A | 3/1995 | Washizu et al. | |
| 5,416,712 A | 5/1995 | Geier et al. | |
| 5,420,592 A | 5/1995 | Johnson | |
| 5,420,593 A | 5/1995 | Niles | |
| 5,422,813 A | 6/1995 | Schuchmman et al. | |
| 5,440,313 A | 8/1995 | Osterdock et al. | |
| 5,450,344 A | 9/1995 | Woo et al. | |
| 5,475,705 A * | 12/1995 | Dent ............................ 375/333 | |
| 5,504,684 A | 4/1996 | Lau et al. | |
| 5,506,587 A | 4/1996 | Lans | |
| 5,535,278 A | 7/1996 | Cahn et al. | |
| 5,587,715 A | 12/1996 | Lewis | |
| 5,592,173 A | 1/1997 | Lau et al. | |
| 5,594,453 A | 1/1997 | Rodal et al. | |
| 5,625,668 A | 4/1997 | Loomis et al. | |
| 5,629,708 A | 5/1997 | Rodal et al. | |
| 5,654,718 A | 8/1997 | Beason et al. | |
| 5,663,734 A | 9/1997 | Krasner | |
| 5,663,735 A * | 9/1997 | Eshenbach ............... 342/357.15 | |
| 5,666,330 A | 9/1997 | Zampetti | |
| 5,697,082 A * | 12/1997 | Greer et al. ................... 455/255 | |
| 5,701,328 A | 12/1997 | Schuchman et al. | |
| 5,726,893 A | 3/1998 | Schuchman et al. | |
| 5,739,786 A | 4/1998 | Greenspan et al. | |
| 5,757,786 A | 5/1998 | Joo | |
| 5,764,184 A | 6/1998 | Hatch et al. | |
| 5,781,156 A | 7/1998 | Krasner | |
| 5,786,789 A * | 7/1998 | Janky ........................ 342/357.1 | |
| 5,812,087 A | 9/1998 | Krasner | |
| 5,825,327 A | 10/1998 | Krasner | |
| 5,828,694 A | 10/1998 | Schipper | |
| 5,831,574 A | 11/1998 | Krasner | |
| 5,841,396 A | 11/1998 | Krasner | |
| 5,845,203 A | 12/1998 | LaDue | |
| 5,854,605 A | 12/1998 | Gildea | |
| 5,874,914 A | 2/1999 | Krasner | |
| 5,877,724 A * | 3/1999 | Davis ........................ 342/357.1 | |
| 5,877,725 A | 3/1999 | Kalafus | |
| 5,883,594 A | 3/1999 | Lau | |
| 5,884,214 A | 3/1999 | Krasner | |
| 5,889,474 A | 3/1999 | LaDue | |
| 5,893,044 A | 4/1999 | King et al. | |
| 5,897,605 A | 4/1999 | Kohli et al. | |
| 5,901,171 A | 5/1999 | Kohli et al. | |
| 5,903,654 A | 5/1999 | Milton et al. | |
| 5,907,578 A | 5/1999 | Pon et al. | |
| 5,907,809 A | 5/1999 | Molnar et al. | |
| 5,917,444 A | 6/1999 | Loomis et al. | |
| 5,920,283 A | 7/1999 | Shaheen et al. | |
| 5,923,703 A | 7/1999 | Pon et al. | |
| 5,926,131 A | 7/1999 | Sakumoto et al. | |
| 5,928,306 A | 7/1999 | France et al. | |
| 5,936,572 A | 8/1999 | Loomis et al. | |
| 5,940,027 A | 8/1999 | Forseth et al. | |
| 5,943,363 A | 8/1999 | Hanson et al. | |
| 5,943,381 A * | 8/1999 | Zampetti ...................... 375/376 | |
| 5,945,944 A * | 8/1999 | Krasner .................. 342/357.06 | |
| 5,963,582 A | 10/1999 | Stansell, Jr. | |
| 5,966,403 A | 10/1999 | Pon | |
| 5,977,909 A | 11/1999 | Harrison et al. | |
| 5,982,324 A | 11/1999 | Watters et al. | |
| 5,987,016 A | 11/1999 | He | |
| 5,999,124 A | 12/1999 | Sheynblat | |
| 6,002,362 A | 12/1999 | Gudat | |
| 6,002,363 A | 12/1999 | Krasner | |
| 6,009,551 A | 12/1999 | Sheynblat | |
| 6,016,119 A | 1/2000 | Krasner | |
| 6,018,704 A | 1/2000 | Kohli et al. | |
| 6,040,798 A | 3/2000 | Kinal et al. | |
| 6,041,222 A * | 3/2000 | Horton et al. .................. 455/255 | |
| 6,041,280 A | 3/2000 | Kohli et al. | |
| 6,047,017 A | 4/2000 | Cahn et al. | |
| 6,052,081 A | 4/2000 | Krasner | |
| 6,058,338 A | 5/2000 | Agashe et al. | |
| 6,061,018 A | 5/2000 | Sheynblat | |
| 6,064,336 A | 5/2000 | Krasner | |
| 6,075,987 A | 6/2000 | Camp et al. | |
| 6,081,229 A | 6/2000 | Soliman et al. | |
| 6,085,090 A | 7/2000 | Yee et al. | |
| 6,091,362 A * | 7/2000 | Stilp et al. ..................... 342/465 | |
| 6,097,974 A | 8/2000 | Camp, Jr. et al. | |
| 6,104,338 A | 8/2000 | Krasner | |
| 6,104,340 A | 8/2000 | Krasner | |
| 6,104,712 A | 8/2000 | Robert et al. | |
| 6,107,960 A | 8/2000 | Krasner | |
| 6,111,540 A | 8/2000 | Krasner | |
| 6,111,541 A | 8/2000 | Karmel | |
| 6,122,506 A | 9/2000 | Lu et al. | |
| 6,125,325 A | 9/2000 | Kohli | |
| 6,131,067 A | 10/2000 | Girerd et al. | |
| 6,133,871 A | 10/2000 | Krasner | |
| 6,133,873 A | 10/2000 | Krasner | |
| 6,133,874 A | 10/2000 | Krasner | |
| 6,150,980 A | 11/2000 | Krasner | |
| 6,172,640 B1 | 1/2001 | Durst et al. | |
| 6,178,195 B1 | 1/2001 | Durboraw, III et al. | |
| 6,185,427 B1 | 2/2001 | Krasner et al. | |
| 6,188,351 B1 | 2/2001 | Bloebaum | |
| 6,198,765 B1 | 3/2001 | Cahn et al. | |
| 6,204,808 B1 | 3/2001 | Bloebaum et al. | |
| 6,208,290 B1 | 3/2001 | Krasner | |
| 6,208,291 B1 | 3/2001 | Krasner | |
| 6,211,817 B1 | 4/2001 | Eschenbach | |
| 6,211,819 B1 | 4/2001 | King et al. | |
| 6,215,441 B1 | 4/2001 | Moeglein | |
| 6,215,442 B1 | 4/2001 | Sheynblat | |
| 6,222,484 B1 | 4/2001 | Seiple et al. | |
| 6,225,944 B1 | 5/2001 | Hayes | |
| 6,229,478 B1 | 5/2001 | Biacs et al. | |
| 6,236,354 B1 | 5/2001 | Krasner | |
| 6,236,365 B1 | 5/2001 | LeBlanc et al. | |
| 6,236,937 B1 | 5/2001 | Kohli | |
| 6,239,742 B1 | 5/2001 | Krasner | |
| 6,240,556 B1 * | 5/2001 | Evans et al. ................... 725/114 | |
| 6,249,245 B1 | 6/2001 | Watters et al. | |
| 6,249,542 B1 | 6/2001 | Kohli et al. | |
| 6,252,543 B1 | 6/2001 | Camp et al. | |
| 6,259,399 B1 | 7/2001 | Krasner | |
| 6,263,280 B1 | 7/2001 | Stingone, Jr. | |
| 6,272,430 B1 | 8/2001 | Krasner | |
| 6,289,041 B1 | 9/2001 | Krasner | |
| 6,292,749 B2 | 9/2001 | Kohli | |
| 6,295,023 B1 | 9/2001 | Bloebaum | |
| 6,307,504 B1 | 10/2001 | Sheynblat | |
| 6,313,786 B1 | 11/2001 | Sheynblat et al. | |
| 6,314,308 B1 | 11/2001 | Sheynblat | |
| 6,327,473 B1 | 12/2001 | Soliman et al. | |
| 6,329,946 B1 | 12/2001 | Hirata et al. | |
| 6,347,228 B1 | 2/2002 | Ludden et al. | |
| 6,353,412 B1 | 3/2002 | Soliman | |
| 6,353,642 B1 * | 3/2002 | Asahara et al. ................. 375/344 | |
| 6,377,209 B1 | 4/2002 | Krasner | |
| 6,389,291 B1 | 5/2002 | Pande et al. | |
| 6,393,046 B1 | 5/2002 | Kohli et al. | |
| 6,400,314 B1 | 6/2002 | Krasner | |
| 6,400,753 B1 | 6/2002 | Kohli et al. | |
| 6,405,132 B1 | 6/2002 | Breed et al. | |
| 6,408,196 B2 | 6/2002 | Sheynblat | |
| 6,411,254 B1 | 6/2002 | Moeglein | |

| | | |
|---|---|---|
| 6,411,811 B2 | 6/2002 | Kingdon et al. |
| 6,411,892 B1 | 6/2002 | Van Digglen |
| 6,414,987 B1 | 7/2002 | Pon |
| 6,417,801 B1 | 7/2002 | Van Diggelen |
| 6,421,002 B2 | 7/2002 | Krasner |
| 6,421,609 B2 | 7/2002 | Kohli |
| 6,427,120 B1 | 7/2002 | Garin et al. |
| 6,429,809 B1 | 8/2002 | Vayanos et al. |
| 6,429,814 B1 | 8/2002 | Van Diggelen et al. |
| 6,429,815 B1 | 8/2002 | Soliman |
| 6,433,731 B1 | 8/2002 | Sheynblat |
| 6,433,739 B1 | 8/2002 | Soliman |
| 6,453,237 B1 | 9/2002 | Fuchs et al. |
| 6,456,234 B1 | 9/2002 | Johnson |
| 6,462,708 B1 | 10/2002 | Tsujimoto et al. |
| 6,466,612 B2 | 10/2002 | Kohli et al. |
| 6,473,030 B1 | 10/2002 | McBurney et al. |
| 6,473,694 B1 * | 10/2002 | Akopian et al. ............ 701/213 |
| 6,480,145 B1 | 11/2002 | Hasegawa |
| 6,484,097 B2 | 11/2002 | Fuchs et al. |
| 6,487,499 B1 | 11/2002 | Fuchs et al. |
| 6,501,420 B2 * | 12/2002 | Townsend et al. ......... 342/357.1 |
| 6,505,161 B1 | 1/2003 | Brems |
| 6,510,387 B2 | 1/2003 | Fuchs et al. |
| 6,519,466 B2 | 2/2003 | Pande et al. |
| 6,522,682 B1 | 2/2003 | Kohli et al. |
| 6,526,352 B1 | 2/2003 | Breed et al. |
| 6,529,829 B2 * | 3/2003 | Turetzky et al. |
| 6,535,815 B2 | 3/2003 | Bloebaum |
| 6,542,821 B2 | 4/2003 | Krasner |
| 6,542,823 B2 * | 4/2003 | Garin et al. |
| 6,559,793 B1 | 5/2003 | Eschenbach |
| 6,570,530 B2 | 5/2003 | Gaal et al. |
| 6,574,558 B2 | 6/2003 | Kohli |
| 6,583,734 B2 * | 6/2003 | Bates et al. |
| 6,583,757 B2 | 6/2003 | Krasner |
| 6,590,945 B1 * | 7/2003 | Brardjanian et al. ......... 375/340 |
| 6,597,311 B2 | 7/2003 | Sheynblat |
| 6,633,255 B2 * | 10/2003 | Krasner |
| 6,633,814 B2 | 10/2003 | Kohli et al. |
| 6,650,694 B1 * | 11/2003 | Brown et al. |
| 6,671,620 B1 | 12/2003 | Garin |
| 6,677,894 B2 * | 1/2004 | Sheynblat et al. |
| 6,684,158 B1 * | 1/2004 | Gariu et al. |
| 6,707,423 B2 * | 3/2004 | Turetzky et al. |
| 6,720,920 B2 * | 4/2004 | Breed et al. |
| 6,724,811 B2 | 4/2004 | Kohli et al. |
| 6,731,238 B2 * | 5/2004 | Johnson |
| 6,738,630 B2 * | 5/2004 | Ashmore |
| 6,748,015 B2 | 6/2004 | Kohli et al. |
| 6,748,217 B1 * | 6/2004 | Hunzinger et al. |
| 6,778,885 B2 | 8/2004 | Agashe et al. |
| 6,829,534 B2 * | 12/2004 | Fuchs et al. |
| 6,873,288 B2 * | 3/2005 | Heppe |
| 6,915,208 B2 | 7/2005 | Garin et al. |
| 7,012,563 B1 * | 3/2006 | Bustamante et al. ...... 342/357.1 |
| 7,091,904 B2 | 8/2006 | Vantalon et al. |
| 7,120,390 B2 * | 10/2006 | Grundvig et al. ............ 455/41.2 |
| 7,142,878 B1 * | 11/2006 | Barroso et al. ............. 455/456.6 |
| 7,154,436 B1 | 12/2006 | Chadha |
| 7,239,682 B2 * | 7/2007 | Liu et al. ...................... 375/355 |
| 7,424,069 B1 * | 9/2008 | Nicholls et al. ............... 375/339 |
| 2001/0002203 A1 | 5/2001 | Cahn et al. |
| 2002/0019698 A1 | 2/2002 | Vilppula et al. |
| 2002/0064209 A1 | 5/2002 | Turetzky et al. |
| 2002/0072854 A1 | 6/2002 | Fuchs et al. |
| 2002/0080063 A1 | 6/2002 | Bloebaum et al. |
| 2002/0082774 A1 | 6/2002 | Bloebaum |
| 2002/0142783 A1 | 10/2002 | Yoldi et al. |
| 2002/0145560 A1 | 10/2002 | Tsujimoto et al. |
| 2002/0172223 A1 * | 11/2002 | Stilp ........................... 370/480 |
| 2002/0183069 A1 * | 12/2002 | Myr ............................. 455/456 |
| 2002/0186165 A1 | 12/2002 | Eschenbach |
| 2003/0016170 A1 | 1/2003 | Jandrell |
| 2003/0104818 A1 * | 6/2003 | Kotziu |
| 2003/0112176 A1 | 6/2003 | Vayanos et al. |
| 2003/0125044 A1 * | 7/2003 | Deloach et al. |
| 2003/0128157 A1 | 7/2003 | Salkhi |
| 2003/0176204 A1 * | 9/2003 | Abraham |
| 2003/0212487 A1 | 11/2003 | Dooley et al. |
| 2004/0130484 A1 * | 7/2004 | Krasner |
| 2004/0162084 A1 * | 8/2004 | Wang |
| 2004/0263386 A1 | 12/2004 | King et al. |
| 2006/0038719 A1 | 2/2006 | Pande et al. |
| 2006/0181452 A1 | 8/2006 | King et al. |

FOREIGN PATENT DOCUMENTS

| | | |
|---|---|---|
| EP | 0511741 | 11/1992 |
| EP | 1 092 987 | 4/2001 |
| EP | 1 427 236 A | 6/2004 |
| EP | 1 452 886 A | 9/2004 |
| GB | 2115195 | 1/1983 |
| GB | 2 335 554 A | 3/1998 |
| GB | 2335554 A * | 9/1999 |
| JP | 58-105632 * | 6/1983 |
| JP | 7-36035 | 5/1986 |
| JP | 4-326079 | 11/1992 |
| JP | 2000-102058 | 4/2000 |
| WO | WO 90/11652 | 10/1990 |
| WO | WO 99/47943 * | 9/1999 |
| WO | WO 00/10028 | 2/2000 |
| WO | WO 00/10031 | 2/2000 |
| WO | WO 00/45191 | 8/2000 |
| WO | WO 01/62034 A | 8/2001 |
| WO | WO 02/04975 | 1/2002 |
| WO | WO 03/098258 | 11/2003 |
| WO | WO2006014170 | 2/2006 |

OTHER PUBLICATIONS

New Fast GPS Code-Acquisition Using FFT, Electronic Letters, vol. 27, No. 2, pp. 158-160 (1991).
Novel Fast GPS/GLONASS Code Acquisition Technique Using Low Update Rate FFT, Electronic Letters, vol. 28, No. 9, pp. 863-865 (1992).
Marketing Material: Qualcomm CDMA Technologies—Integrated Solutions MGP6200™ Multimode GPS Processor (8 pages).
Marketing Material: uNav Microelectronics—uN9+18 Low Power, High Performance GPS Receiver Chipset/uN9+18 GPS Receiver Solution (9 pages).
Marketing Material: uNav Microelectronics, uN9+18 Low Power, High Performance GPS Receiver Chipset (2 pages).
Marketing Material: Global Locate—Hammerhead II™, Single Chip AGPS Solution (2 pages).
Marketing Material/Press Release: Broadcom Introduces Advanced Single-Chip GPS Solution for Mobile Applications (3pages).
Marketing Material/White Paper: SnapTrack: A Qualcomm Company—Snap Track's Wireless Assisted GPS™ (A-GPS) Solution Provides the Industry's Best Location System—Location Technologies for GSM, GPRS and WCDMA Networks (Qualcomm CDMA Technologies: Enabling the Future of Communications (4 pages).
Soliman et al., gps One: A hybrid position location system, 2000 IEEE, pp. 334-335.

* cited by examiner

*Primary Examiner* — Edward Urban
*Assistant Examiner* — Junpeng Chen
(74) *Attorney, Agent, or Firm* — RatnerPrestia

(57) ABSTRACT

A frequency phase correction system and method are described that provides a receiver with a greater ability to lock onto relatively weak radio frequency signals by determining and estimating an amount of frequency error in a local frequency reference of the receiver, and using the error estimate to maintain frequency coherence with a received signal, thereby allowing tracking over a longer period of time, enabling longer integration times to capture weaker signals without losing frequency coherence.

81 Claims, 9 Drawing Sheets

FREQUENCY PHASE CORRECTION SYSTEM

CROSS REFERENCE TO RELATED APPLICATIONS

This application is a continuation-in-part of U.S. patent application Ser. No. 10/885,507, filed Jul. 3, 2004, titled "Aided Location Communication System," which application is incorporated into this application by reference in its entirety and which application is:

(a) a continuation in part of PCT application Serial No. PCT/US03/16308, filed May 22, 2003, titled "Aiding in a Satellite Positioning System," which is a continuation-in-part of U.S. patent application Ser. No. 10/155,614, filed May 22, 2002, titled "A Method for Aiding a Global Positioning System," now U.S. Pat. No. 6,684,158, which is a continuation-in-part of U.S. patent application Ser. No. 09/795,871, filed Feb. 28, 2001, titled "Information Transfer in a Multi-mode Global Positioning System Used with Wireless Networks," now U.S. Pat. No. 6,427,120, which claims priority under Section 119(e) to U.S. Provisional Application Ser. No. 60/225,076, filed Aug. 14, 2000, all of which are incorporated into this application in their entirety by reference;

(b) a continuation-in-part of U.S. patent application Ser. No. 10/385,198, filed Mar. 10, 2003 now U.S. Pat. No. 6,915,208, titled "Information Transfer in a Multi-mode Global Positioning System Used with Wireless Networks," which is a continuation of U.S. patent application Ser. No. 10/127,229, filed Apr. 19, 2002, titled "Information Transfer in a Multi-mode Global Positioning System Used with Wireless Networks," now U.S. Pat. No. 6,542,823, which is a continuation of U.S. patent application Ser. No. 09/795,871, filed Feb. 28, 2001, titled "Information Transfer in a Multi-mode Global Positioning System Used with Wireless Networks," now U.S. Pat. No. 6,427,120, which claims priority under Section 119(e) to U.S. Provisional Application Ser. No. 60/225,076, filed Aug. 14, 2000, all of which are incorporated into this application in their entirety by reference;

(c) a continuation-in-part of U.S. patent application Ser. No. 10/194,627, filed Jul. 12, 2002 now U.S. Pat. No. 7,577,448, titled "Multi-mode Global Positioning System For Use with Wireless Networks," which is a continuation of U.S. patent application Ser. No. 10/068,751, filed Feb. 5, 2002, titled "Multi-mode Global Positioning System For Use with Wireless Networks," now U.S. Pat. No. 6,519,466, which is a continuation of U.S. patent application Ser. No. 09/781,068, filed Feb. 8, 2001, titled "Multi-mode Global Positioning System For Use with Wireless Networks," now U.S. Pat. No. 6,389,291, which claims priority under Section 119(e) to U.S. Provisional Application Ser. No. 60/225,076, filed Aug. 14, 2000, all of which are incorporated into this application in their entirety by reference; and (d) a continuation-in-part of U.S. patent application Ser. No. 10/700,821, filed Nov. 4, 2003 now U.S. Pat. No. 7,263,440, titled "Satellite Based Positioning Method and System for Coarse Location Positioning," which is a continuation-in-part of U.S. patent application Ser. No. 09/575,492, filed May 18, 2000, titled "Method and Apparatus for Determining Global Position Using Almanac Information," now U.S. Pat. No. 6,671,620, all of which are incorporated into this application in their entirety by reference.

This application is also a continuation-in-part of U.S. patent application Ser. No. 10/759,677 filed Jan. 18, 2004, titled "Fast Reacquisition of a GPS Signal," which is a continuation-in-part of U.S. patent application Ser. No. 10/017,115, filed Dec. 13, 2001, titled "Fast Acquisition of a GPS Signal," now U.S. Pat. No. 6,778,136, all of which are incorporated into this application in their entirety by reference.

BACKGROUND OF THE INVENTION

1. Field of Invention

This invention relates to Global Positioning ("GPS") receivers, and in particular to high-sensitivity GPS receivers for use with wireless networks.

2. Related Art

The worldwide utilization of wireless devices such as two-way radios, portable televisions, Personal Digital Assistants ("PDAs") cellular telephones (also generally known a "mobile phones" and/or "cell phones"), satellite radio receivers and Global Positioning Systems ("GPS") is growing at a rapid pace. Cellular telephones, including Code Division Multiple Access ("CDMA"), Global System for Mobile Communication ("GSM"), and Personal Communication System ("PCS") devices, have become commonplace in today's society. The use of these and other wireless devices to provide voice, data, and other services, such as Internet access, has provided many conveniences to cellular system users. Additionally, the number of features and applications offered by many wireless devices and wireless service providers is increasingly matching, and in many cases outpacing, the features offered by traditional land-line telephone devices and service providers. Features such as call waiting, call forwarding, caller identification ("caller I.D."), three-way calling, data transmission and others are commonly offered by both land-line and wireless service providers. These features generally operate in a similar manner on both wireless devices and land-line telephones. Additional features and applications such as "free" long distance, Internet access, electronic gaming, built-in cameras, personal data assistants ("PDAs"), and the like make wireless communication devices a popular choice among many consumers.

Furthermore, the usage of other wireless communications systems, such as two-way paging, trunked radio, Specialized Mobile Radio ("SMR"), by police, fire, and paramedic departments, has also become common for mobile communications. The explosive growth of wireless communications systems has not stopped there. Emergency response teams use wireless communications to stay in contact with hospitals, fire departments and police departments. Taxicabs, buses, delivery trucks and even tractor trailers use wireless communications to dispatch services, track vehicles and monitor routes. School buses in some communities even use wireless communications to automatically alert parents when they are within a few minutes of a pick-up point. Businesses large and small use wireless communications to deliver services, monitor inventory and manage workforces.

GPS systems (also known as Satellite Positioning System "SPS" or Navigation Satellite System) have also become commonplace. In general, GPS systems are typically satellite (also known as "space vehicle" or "SV") based navigation systems. Examples of navigation systems include but are not limited to the United States ("U.S.") Navy Navigation Satellite System ("NNSS") (also know as TRANSIT), LORAN, Shoran, Decca, TACAN, NAVSTAR (an older name for GPS), the Russian counterpart to NAVSTAR known as the Global Navigation Satellite System ("GLONASS") and the future Western European proposed "Galileo" program. As an example, the US NAVSTAR GPS system is described in GPS Theory and Practice, Fifth ed., revised edition by Hofmann-Wellenhof, Lichtenegger and Collins, Springer-Verlag Wien New York, 2001, which is fully incorporated herein by reference.

Typically, GPS receivers receive radio transmissions from satellite-based radio navigation systems and use those received transmissions to determine the location of the GPS receiver. The nominal GPS operational constellation generally comprises 24 satellites, each of which make a complete orbit of the earth in 12 hours. There are often more than 24 operational satellites as new ones are launched to replace older satellites. The ground track (path followed by the satellite over the ground as the earth rotates beneath it) of each satellite orbit repeats almost exactly, once each day. The orbit altitude is such that the satellites repeat the same track and configuration over any point approximately each 24 hours (4 minutes earlier each day). There are six orbital planes (with nominally four satellites in each), equally spaced (60 degrees apart), and inclined at about fifty-five degrees with respect to the equatorial plane. This constellation provides the user with between five and eight satellites visible from any point on the earth.

Generally, each GPS satellite in a GPS satellite-based radio navigation system broadcasts a radio transmission, that contains its location information, and orbit information. More specifically, the information contained in the signal broadcast by the GPS satellite includes time-tagged data bits marking the time of transmission of each of a plurality of subframes at the time they are transmitted by the satellite, a data frame being transmitted every thirty seconds. Three six-second subframes contain orbital and clock data. Satellite Clock corrections as well as precise satellite orbital data sets (ephemeris data parameters) for the transmitting satellite are sent in multiple subframes. Additional subframes transmit different pages of system data. An entire set of twenty-five frames (125 subframes) makes up the complete Navigation Message that is sent over a 12.5 minute period.

As an example, each of the orbiting GPS satellites in the United States GPS system contains four highly accurate atomic clocks: two Cesium and two Rubidium. These clocks provide precision timing pulses, which are utilized in generating two unique binary codes (also known as a pseudo random noise "PRN," or pseudo noise "PN" code), that are transmitted from the GPS satellites to Earth. These PN codes identify the specific GPS satellite in the GPS constellation.

Each GPS satellite also transmits a set of digitally coded ephemeris data that completely defines the precise orbit of the GPS satellite. The ephemeris data indicates where the GPS satellite is at any given time, and its location may be specified in terms of the GPS satellite ground track in precise latitude and longitude measurements. The information in the ephemeris data is coded and transmitted from the GPS satellite providing an accurate indication of the exact position of the GPS satellite above the earth at any given time. It is appreciated by those skilled in the art that the location of the GPS receiver may be determined by applying the well-known concept of intersection utilizing the determined distances from the GPS receiver to three GPS satellites that have known GPS satellite locations.

The GPS receiver produces replicas of a coarse acquisition ("CA") code sequence for a specific satellite with some form of a CA code generator. PRN codes are defined for 32 satellite identification numbers. Some GPS receivers may store a complete set of precomputed CA code chips in locally, but a hardware implementation, such as a shift register, can also be used. The CA code generator produces a different 1023 chip sequence for each phase tap setting. In a hardware implementation, the code chips can be shifted in time, for example by slewing the clock that controls the shift registers. In an implementation where the codes are stored locally, the required code chips are retrieved from memory.

The CA code generator repeats the same 1023-chip PRN-code sequence every millisecond. The receiver adjusts the code replica in time until it finds a match, or correction, with the PRN code received from the satellite. Once the codes begin to align, signal power levels begin to be detected. When complete correction is achieved, a spread-spectrum carrier signal is de-spread and full signal power is detected.

A phase locked loop ("PLL") that can lock to the signal is used to demodulate a navigation message from the GPS carrier signal. The same loop can be used to measure and track the carrier frequency and any associated Doppler shift. By keeping track of the changes to a numerically controlled oscillator, carrier frequency phase can be tracked and measured as well.

The position of the receiver is determined as the point where the pseudo-ranges from a set of GPS satellites intersect, and is found from multiple pseudo-range measurements at a single measurement epoch. The pseudo range measurements are used together with estimates of satellite positions determined by the ephemeris data received from each satellite during the measurement. The ephemerides allows the receiver to compute the satellite positions in three dimensions at the point in time they sent their respective signals. Four satellites can be used to determine three position dimensions and time. Position dimensions are typically computed by the receiver in Earth-Centered, Earth-Fixed X, Y, Z ("ECEF XYZ") coordinates.

The time measurement is used to correct any offset occurring within the clock in the receiver. Consequently, in most applications, a relatively inexpensive clock can be implemented in the receiver, saving on the cost of the bill of materials for the receiver device. Receiver position can be computed from the determined satellite positions, the measured pseudo-ranges (corrected for clock offsets, latency introduced from ionospheric delays, and relativistic effects), and a receiver position estimate. If a more optimum receiver clock is provided, three satellites can be used to determine three position dimensions. In practice, however, this is rarely achievable, and four satellites are used to compute a three dimensional fix with the user clock error removed, or three satellites are used to compute a two-dimensional, horizontal fix (in latitude and longitude) given an assumed altitude.

With the growing widespread use of these technologies, current trends are calling for the incorporation of GPS services into a broad range of electronic devices and systems, including PDAs, cellular telephones, portable computers, radios, satellite radios, trucked radio, SMR, automobiles, two-way pagers and the like. At the same time, electronic device manufacturers constantly strive to reduce costs, enhance performance, augment feature sets, extend battery life, and produce the most cost-attractive product possible for consumers.

In cellular telephony, the interest of integrating GPS receivers with cellular telephones stems from a new Federal Communications Commission ("FCC") requirement that cellular telephones be locatable to within 50 meters once an emergency call, such as a "911" call (also referred to as "Enhanced 911" or "E911") is placed by a given cellular telephone. When emergencies occur, people are accustomed to dialing 9-1-1 (normally referred to as a "911" call) on a land-based (also known as "land-line") telephone via the public switched telephone network ("PSTN"), which contacts an emergency response center that is able to automatically identify the location of the land-based telephone where the call originated.

Unfortunately, because wireless devices, such as cellular telephones, are not hard wired into the PSTN and can move about, the emergency response center cannot determine their location as is possible with automatic-number-identification ("ANI") techniques available for use with land-line calls. Furthermore, conventional wireless devices without a position determination capability are unable to automatically determine and communicate their location without a person actively entering or describing their location. In response, the United States Congress, through the FCC, has enacted a requirement that cellular telephones be locatable to within 50 meters once an emergency mobile telephone call, such as an E911 call, is placed by a user on a given cellular telephone. This type of position data would assist police, paramedics, and other law enforcement and public service personnel, as well as other agencies that may need to have legal rights to determine the position of specific cellular telephone. The E911 services, however, operate differently on wireless devices than a 911 call does on land-line telephones.

When a 911 call is placed from a land-line telephone, the 911 reception center receives the call and determines the origin of the call. In case the caller fails, or forgets, to identify his or her location, the 911 reception center is able to obtain the location from which the call was made from and send emergency personnel to the location of the call. Thus, even if the caller is unable to give his or her position, emergency personnel can be dispatched to the location from which the call was made.

If instead, an E911 call is placed from a wireless device such as a cellular telephone, the E911 reception center receives the call but cannot determine the origin of the call without information provided by the person who made the call. If the caller fails to, forgets to, or simply cannot identify his or her location, the E911 reception center is unable to determine the precise location of the call because the wireless device is only tied to the PSTN at a central location, such as a base-station, for example. At present, the best that the E911 reception center may do is to determine the location of the cell site from which the call was placed. Unfortunately, typical cell sites in a wireless network system may cover an area with approximately a 30-mile diameter. Further refinement of the location may be determinable in a digital network by the power setting of the calling wireless device. But, this still results in an area covering multiple miles. Therefore, emergency personnel cannot be dispatched to the scene without more information.

A proposed solution to this problem includes integrating GPS receivers with cellular telephones. An added benefit to this proposed solution is that any position or position-related data produced by an integrated GPS receiver may be utilized by the cellular telephone user for directions, latitude and longitude positions (locations or positions) of other locations or other cellular telephones that the cellular user is trying to locate, determination of relative location of the cellular user to other landmarks, directions for the cellular telephone user via internet maps or other GPS mapping techniques, and the like. Such data may be of use for other than E911 calls, and would be very useful for cellular and PCS subscribers.

As an example of the current thrust to integrate GPS receivers with cellular telephony, U.S. Pat. No. 5,874,914, issued to Krasner, which is incorporated by reference herein in its entirety, describes a method wherein a base station (also known as a base station and/or the Mobile Telephone Switching Office "MTSO") transmits GPS satellite information, including Doppler information, to a remote unit (such as cellular telephone) utilizing a cellular data link, and computing pseudoranges to the in-view GPS satellites without the handset having to receive GPS satellite ephemeris information directly from the satellites. Another patent that concerns assistance between the GPS system and wireless networks is U.S. Pat. No. 5,365,450, issued to Schuchman, et al., which is also incorporated by reference herein in its entirety.

The integration of GPS capabilities with a wireless communication device, however, presents some challenges. For example, due to their mobile nature and because mobile-device designers are striving for smaller packaging as well as longer battery life, wireless communication devices often find themselves in areas where the signal strength of received GPS signals is weaker than desired. As a result, it may be a challenge for the GPS receiver to receive and lock onto the GPS signal received from the GPS satellites.

Therefore, there is a need in the art for a GPS receiver that can receive and recognize signals from the GPS constellation in situations where signal strength is weaker than desired.

SUMMARY

A receiver reference oscillator frequency correction system and method is described that provides a receiver with a greater ability to lock onto relatively weak radio frequency signals. More particularly, the present invention is directed toward a system and method for determining and estimating an amount of frequency error in a local frequency reference of a receiver, and using the error estimate to create or maintain improved frequency coherence with a received signal.

The invention may be implemented with receivers in various systems including position determination systems, and is particularly well suited to an environment wherein a wireless communication device is combined with a position determination system, such as, for example, in an Aided Location Communication Device. Various examples of implementations are described that provide tracking of the rate of change of a frequency error $\Delta f$ of the frequency reference used by the wireless device (e.g., the ALCD), using the rate of change (and, optionally at times, higher order derivatives) to estimate the frequency error $\Delta f$ of the frequency reference at a future point in time, and using the estimation of frequency error $\Delta f$ of the frequency reference at a future point in time to maintain frequency coherence while receiving a position signal (e.g., a GPS signal). Determining and estimating frequency changes over time and adjusting the local frequency source appropriately allows tracking over a longer period of time, enabling longer integration times to capture weaker signals without losing frequency coherence. Adjustment of the local frequency source may be achieved, for example, by hardware, software or hybrid techniques.

The above described process may be accomplished by obtaining estimates of an actual frequency error of a local reference frequency oscillator, using these estimates to predict estimates of a frequency error of the reference frequency oscillator in the future, and using these estimate predictions to allow the GPS receiver to track the phase of an incoming GPS signal. As a result, longer integration times are possible as the receiver does not loose coherence with the incoming signal. As a result of allowing longer integration times, the receiver has a greater ability to acquire weak signals. The estimates of frequency error may be obtained using a radio frequency signal received by the communications portion of an ALCD, for example, the received signal of a cellular telephone. Alternatively, estimates of frequency error may be obtained using metrics that may indicate a drift in the reference frequency such as, for example the temperature in which the reference frequency oscillator is operating, which may vary over time.

A filtering system may be utilized with the present invention to provide a frequency estimate having the best (or at least better) noise characteristics of both radio and GPS receive signals and the original reference source. In one example of an implementation, the filtering system may be an adaptive filter, capable of adapting its characteristics based on the input signals it receives.

Application of the frequency coherence system and method may compensate for frequency variations in the reference oscillator frequency as a result of various factors. For example, where the output frequency of the reference oscillator varies as a result of temperature variations, the system and method of the present invention may predict these variations and adjust the reference frequency accordingly.

Thus, as a further advantage of the invention, if the reference frequency used to get a lock on the GPS satellite signal is off by a certain amount, which is referred to as frequency error, the invention determines the frequency error and its drift rate, and uses this characterization data to allow integration of the incoming GPS signal to occur over a longer period of time while maintaining coherence with the incoming signal. As a result, this increases the effective sensitivity of the GPS receiver, allowing detection and measurement of lower signal levels than may otherwise be detected with conventional systems.

The present invention may be implemented in an example of an implementation that provides higher order characterization data to be determined such as, for example, phase jerk. Utilizing these higher-order characterization data allow the receiver to inject an improved drift rate correction factor into the correction algorithm during an interval of processing time. This characterization data, including the higher-order characterization data, can be projected in time to allow application to a future processing interval. Additionally, measurements of varying measurement quality and varying sampling intervals can be combined.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
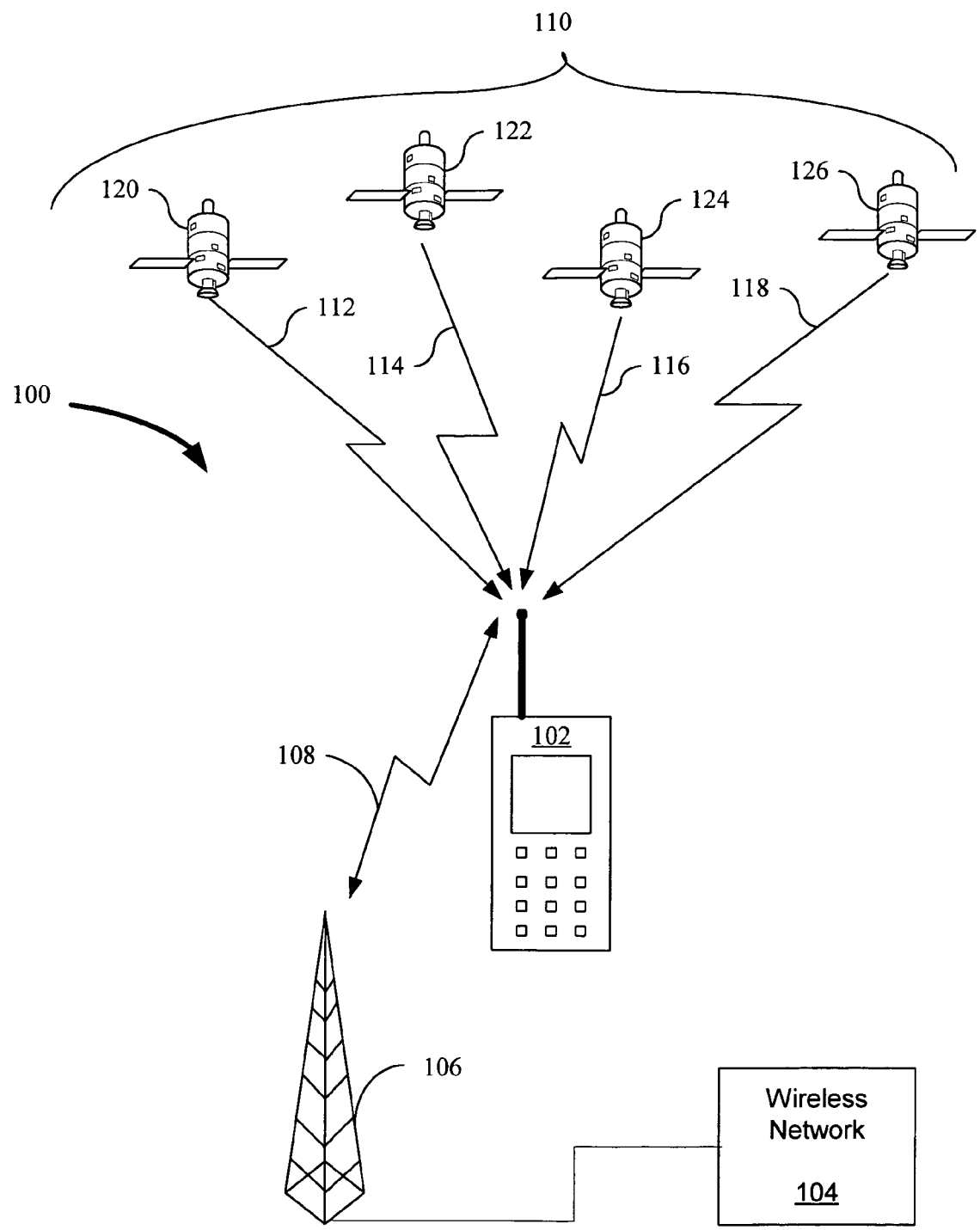
FIG. 1 illustrates an example of an implementation of an Aided Location Communication System ("ALCS") using an Aided Location Communication Device ("ALCD") having a GPS receiver located within the ALCD.

In the following description of the preferred and various alternative embodiments, reference is made to the accompanying drawings that form a part hereof, and in which is shown by way of illustration a specific embodiment in which the invention may be practiced. It is to be understood that other embodiments may be utilized and structural changes may be made without departing from the spirit and scope of this invention.

The invention is described with reference to various functional block diagrams, which illustrate possible applications of and embodiments of the invention from a functional perspective. These functional block diagrams should not be interpreted to imply or otherwise require a particular physical architecture in accordance with the partitioning of the functionality depicted therein. Instead, it will be appreciated by one of ordinary skill in the art that various alternative physical architectures (whether hardware, software or a combination thereof) can be used to implement the described functionality. For example, the invention can be implemented using various hardware and software components, including, for example, using a semiconductor integrated circuit (e.g., a chip) or a combination of semiconductor integrated circuits (e.g., a chipset or multi-chip module), or in associated circuitry, or in the software, firmware, protocol stacks, libraries, algorithms or other processes operating thereon (or in any configuration of one or more of the foregoing). The chip or chipset implementation, may include an integrated circuit, including, for example, any of the following alone or in combination: an application specific integrated circuit, or ASIC, a digital signal processor ("DSP"), or another general-purpose or specific-purpose processor, and associated circuitry (e.g., memory, co-processors, busses, etc.).

Overview

The present invention is directed toward a system and method for determining and estimating an amount of frequency error in a local frequency reference of a receiver in a position determination system, and using the error estimate to correct the local reference frequency signal and thereby maintain frequency coherence with a received signal. While the invention is described herein in terms of various example applications, which include, for example, a GPS receiver integrated with a cellular telephone in an ALCD, one of ordinary skill in the art will appreciate that the system and method of the present invention can be implemented with any wireless communication device where it may be desirable to maintain coherence of a reference frequency signal.

It is also appreciated by those skilled in the art that position-determination, or navigation, systems can include GPS systems as well as other Satellite Positioning Systems "SPS" and/or Navigation Satellite Systems. In general, such navigation systems can typically be satellite-based (also known as "space vehicle" or "SV") navigation systems. Examples of some navigation systems include, but are not limited to, GPS, the United States ("U.S.") Navy Navigation Satellite System ("NNSS") (also know as TRANSIT), LORAN, Shoran, Decca, TACAN, NAVSTAR (the prior name for GPS), the Russian counterpart known as the Global Navigation Satellite System ("GLONASS") and the future Western-European proposed "Galileo" program. As an example, a position determination system is described in GPS Theory and Practice, Fifth ed., revised edition by Hofmann-Wellenhof, Lichtenegger and Collins, Springer-Verlag Wien New York, 2001, which is fully incorporated herein by reference in its entirety.

When integrating GPS system (or other position-determination system) components with wireless communications systems (that may include, for example, cellular, paging, two-way paging, Personal Data Assistant "PDA", Bluetooth, Wi-Fi and PCS systems), it is desirable for the GPS system to have the capability to acquire and track the GPS satellites under conditions that a typical wireless communications system user may encounter with his or her wireless communications device. Some of these conditions may include indoor use, and use in dense urban areas that have limited sky view (such as in downtown areas with skyscrapers blocking satellite views, etc.). Although these conditions are typically somewhat manageable for terrestrial-based wireless communications systems, they are often times more difficult environments for GPS systems. For example, in a traditional "GPS-standalone" mode where a GPS receiver acquires the signals from the GPS satellites, tracks the satellites, and, if desired, performs navigation without any outside information being delivered to the GPS system, typical GPS receivers in these conditions may experience problems with long Time-To-First-Fix ("TTFF") times, and, further, have limited ability to acquire the GPS satellite signals under indoor or limited sky-view conditions.

Even with some additional information, TTFF times may be over thirty seconds because ephemeris data must be acquired from the GPS system itself, which typically requires a strong GPS signal to acquire ephemeris data reliably. These conditions usually impact the reliability of the position availability, as well as the power consumption within wireless communication devices such as, for example, cellular telephones. Even more troubling with conventional GPS receivers in these conditions, is the inability to acquire the GPS satellite signals at all due to weak signal strengths associated with these conditions. When weaker signal strengths are encountered, the GPS receiver typically is required to integrate the received signal over longer periods of time to acquire a solid fix on the signal. Unfortunately, as the integration period progresses, the center frequency of the signal may drift, causing the receiver to loose coherence with the signal before a fix can be established. Consequently, in these conditions the GPS receiver is unable to obtain a fix on the GPS satellite signal for these weaker-strength signals.

To describe this phenomenon in greater detail, the time code data from the GPS satellite is modulated onto a sinusoidal carrier with a center frequency of $f_c$ Hz to allow transmission from the satellite to the receiver. This modulation is accomplished by multiplying the data signal and the sinusoidal carrier signal together. This multiplication is a frequency conversion process that shifts, or upconverts, the data in frequency so that the spectrum is centered around the carrier frequency of $f_c$ Hz. The signal is then transmitted over the communications channel (the atmosphere in the case of GPS) at this frequency.

The frequency-conversion, or upconversion, process is reversed at the GPS receiver in order to bring the data signal back down to baseband. Ideally this step can be accomplished by multiplying the received data signal by a locally generated sinusoid whose frequency is also $f_c$ Hz and whose phase is identical to that of the carrier signal used at the transmitter. This desired signal is centered at DC since the difference of the identical frequencies is 0 Hz. Thus, this process of multiplying the received signal by a locally generated sinusoid of the same frequency as the transmitter's carrier sinusoid, and subsequently low-pass filtering the signal accomplishes the task of bringing the signal back down to baseband. The locally generated sinusoid is typically created by a local reference frequency oscillator in the GPS receiver. In the case of an aided location communications device (ALCD) the local reference frequency oscillator can be that used for the communication portion of the ALCD (e.g., the local oscillator of a cellular telephone).

Unfortunately, in real-world applications, the locally generated sinusoidal signal will have both an unknown phase offset and an unknown frequency offset from the transmitter's carrier signal. These offsets can result from conditions such as oscillator drift due to temperature and time, or the inability of a low-cost oscillator to keep accurate time.

For example, the frequency of the local oscillator $f_{LO}$ at the receiver can be described by the expression $f_{LO}=f_C+\Delta f$, where $f_C$ is the desired center frequency, and $\Delta f$ represents the amount of frequency offset, or frequency error, present at the receiver's local oscillator. Because the local oscillator running at a frequency of $f_C+\Delta f$ Hz is typically an analog component, one way to remove the residual frequency offset of $\Delta f$ Hz is to multiply the signal by another sinusoid with a frequency of $\Delta f$ Hz. A multiplier may be used to remove this offset and put the signal back to baseband, which is referred to as a derotator. A derotator can be implemented using the DSP or other hardware of the device, or using software or a hardware/software combination. Another simple method for removing the frequency error offset is to provide appropriate feedback to the reference frequency oscillator (or its associated functionality, such as, for example, a PLL) to adjust its output frequency back to the center frequency $f_C$. Therefore, it is useful to determine the amount of frequency error $\Delta f$ in the reference oscillator's signal to understand the amount of adjustment necessary.

In some receivers, the final IF is in the form of a digital signal, and the final de-rotation can be accomplished using digital circuitry. A digital numerically controlled oscillator (NCO) can be used to generate digital complex phasor values having an opposite instantaneous phase relative to the estimated instantaneous received signal phase. The complex valued digital LO sample stream can be multiplied by the digital complex received sample stream in a complex multiplier, resulting in a complex baseband value stream. If the de-rotation is done correctly and the digital LO is locked, the resulting sample stream may be a real number, with the imaginary part zero.

To address these challenges, various examples of implementations of a frequency correction system and method are described that provide tracking of the rate of change of a frequency error $\Delta f$ of the frequency source used by the receiver. The system and method determine the rate of change (and, optionally at times, higher order derivatives) to estimate the frequency error $\Delta f$ at a future point in time, or to remove excess noise from a current-time estimate of frequency, and use the estimation of frequency error Δf to maintain frequency coherence while receiving a GPS signal. Determining and estimating frequency changes over time and adjusting the local frequency source appropriately allows tracking over a longer period of time, enabling longer integration times to capture weaker signals without losing frequency coherence.

The example of implementations described herein are suitable for use in various receiver systems, and are described herein in terms of example applications with GPS systems, and ALCD applications. Because the communication portion of the ALCD may typically have a frequency reference (whether internally or externally) utilized by the position determination portion of the ALCD, in these applications the present invention utilizes that frequency reference in performing its measurements. Alternatively the present invention may be implemented in a communication system having its own dedicated frequency reference. In such an example of implementation, a frequency counter or other functionality for measuring the frequency ratio or difference between the frequency reference and the transmitter's frequency can be utilized.

A Typical GPS Architecture

FIG. 1 is a functional block diagram illustrating an example implementation of an Aided Location Communication System ("ALCS") 100 utilizing an example ALCD 102 having a communication section (not shown) and a GPS receiver (not shown) located within the position-determination section (not shown) of the ALCD 102. As illustrated in FIG. 1, during operation, the ALCD 102 is in signal-communication with a wireless network 104 via a base station 106 and wireless transmission path 108, and is also in signal-communication with at least one GPS satellite of the GPS satellite constellation 110 via signal communication paths 112, 114, 116 and 118. It is appreciated by those skilled in the art that while only four GPS satellites 120, 122, 124 and 126 are shown, the GPS satellites 120, 122, 124 and 126 may be any number of GPS satellites from the GPS constellation 110 that are visible to ALCD 102.

The ALCD 102 may include both a GPS receiver (not shown) in a position-determination section (not shown) and a wireless processing section (not shown), also known as a "call processing" section, in a communication section (not shown). The GPS receiver within the ALCD 102 may receive GPS signals from the GPS satellite constellation 110 via signal communication paths 112, 114, 116 and 118 and the communication section of the ALCD 102 may receive wireless communication signals from the wireless network 104 via signal communication path 108 and base station 106. In some implementations, the ALCD 102 may also send wireless communication signals to the wireless network 104 via signal communication path 108 and base station 106.

The ALCD 102 may be a wireless device such as a cellular telephone (also known as a mobile station (MS), wireless handset, cell phone, mobile telephone or mobile phone) or any other type of mobile device, including, but not limited to, personal digital assistants ("PDAs"), pagers, computers and computer equipment, two-way radios, trunked radios, specialized mobile radios ("SMR") or any other device for which it is desirable to determine location information. The ALCD 102 may also be a semiconductor integrated circuit (i.e., a chip) located within the wireless device or a combination of semiconductor integrated circuits (e.g., a chipset or multichip module) located within the wireless device, or the algorithms or processes operating thereon. Examples of the chip or chipset, may include any integrated circuit having a GPS receiver and a transceiver which may include application specific integrated circuit ("ASIC") or ASICs and a processing capability or processor such as, for example, a digital signal processor ("DSP") or DSPs. In the case of a cellular telephone, the ALCD 102 may utilize a cellular transceiver in the communication section that operates at any radio frequency ("RF") band utilizing any transmission schemes including but not limited to CDMA, CDMA-2000, W-CDMA, TDMA, FDMA, GSM, UMTS, AMPS, Bluetooth, Wi-Fi and/or any combination or extension of these transmission schemes or similar schemes.

Base station 106 can be utilized to provide the air interface between ALCD 102 and other communication devices, including, for example, other ALCDs 102, other and traditional wired or land-line type telephones. Base stations 106 thus form the wireless link with the ALCDs 102 at one end as well as interfacing to the wired network infrastructure at the other. For example, with cellular communication systems, there are multiple base stations located throughout a given service area, each base station 106 serving its immediate surrounding area, which is referred to as a cell. When a user places a call, his or her ALCD 102 communicates with a nearby base station 106, which then relays the call via wireless network 104 to a central switching office and then to the conventional land line telephone network, such as the PSTN. Wireless network 104 may comprise a communication network implemented to serve wireless communications devices such as ALCD 102 or may comprise a conventional land-based network such as the PSTN, or may include a combination thereof.

Figure 2:
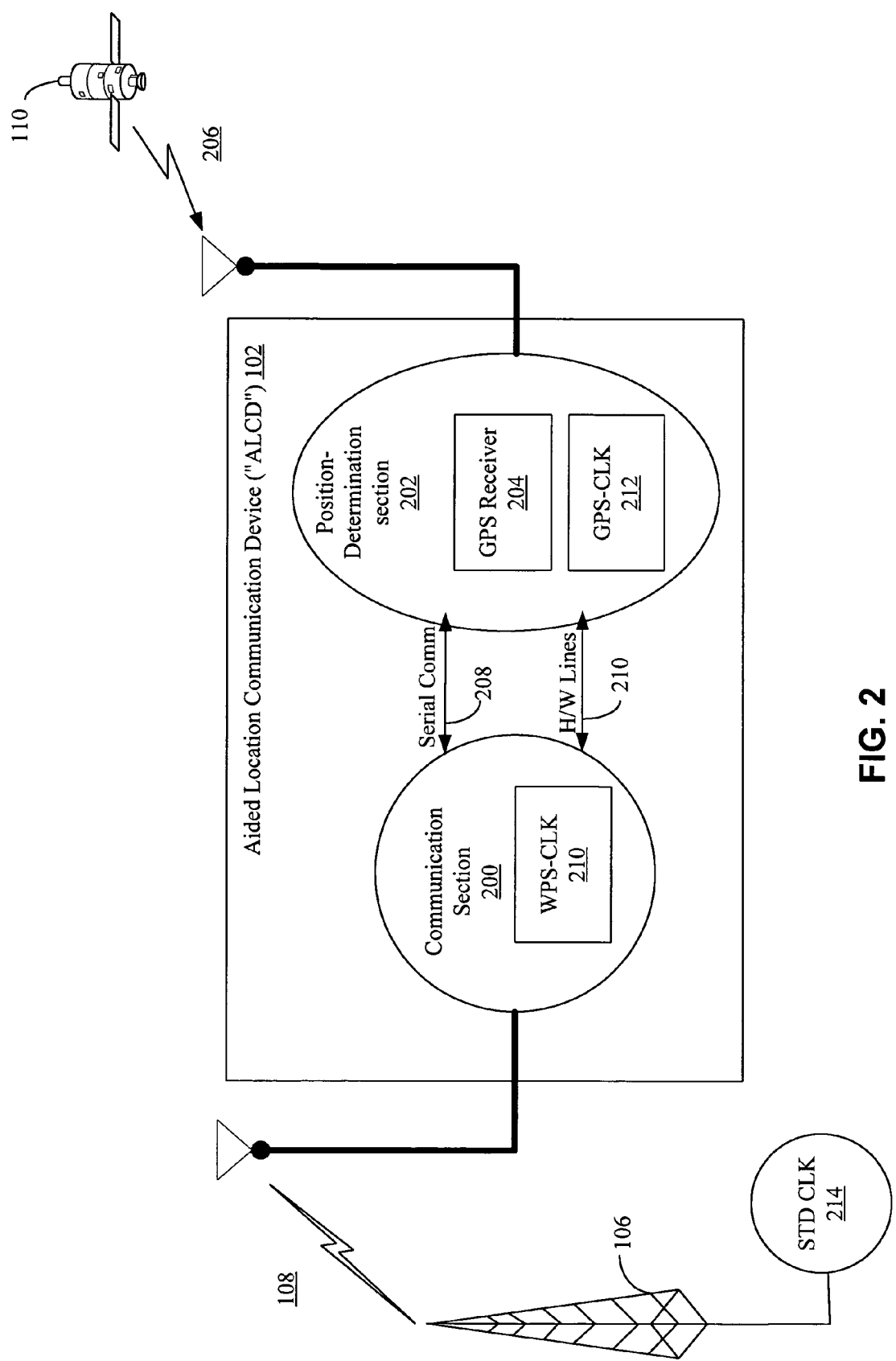
FIG. 2 is a block diagram of an example of an implementation of the ALCD shown in FIG. 1.

FIG. 2 is a block diagram of an example of an implementation of the ALCD 102 shown in FIG. 1. The example ALCD 102 illustrated in FIG. 2, includes both a communication section 200 and a position-determination section 202. The wireless communication section 200 may include a call processing ("CP") section (not shown) that performs the processing functions for the wireless applications and may include a wireless transceiver. For example, in the case of a cellular telephone, the ALCD 102 would include a CP section with a cellular transceiver.

The position-determination section 202 includes a GPS receiver 204 for receiving satellite transmissions 206 from a GPS satellite constellation 110. The position-determination section 202 may also include a non-GPS receiver capable or receiving non-GPS location aiding information as described below. The position-determination section 202 performs the position computation functions for the ALCD 102. By integrating the technology of the communication section 200 with that of the position-determination section 202, the ALCD 102 provides two major service systems: that of a wireless device, such as cellular telephone service, and that of the GPS receiver to provide location information of the ALCD 102. It is appreciated by those skilled in the art that this integration provides for numerous advantages including meeting the E911 requirements as set forth by the Federal Communication Commission ("FCC").

Communication section 200 and position determination section 202 can be implemented using separate chips or chipsets, or, alternatively, their functionality can be combined on a common chip or chipset. For example, in the illustrated example of an implementation, algorithms, circuitry and other intellectual property ("IP") performing the GPS functionality may be integrated to run on or operate with the digital signal processor (DSP) of Communication section 200 and associated chips or circuitry, if any.

Within the ALCD 102, or, alternatively, between ALCD 102 and an external accessory (not shown) to ALCD 102, communications between the communication section 200 and position-determination section 202 take place. These communications allow signals to be transferred from the communication section 200 to the position-determination section 202, and can take place on a serial or parallel communications link 208 or via hardware lines 210, but other connections or interfaces may be used if desired. Communications link 208 can communicate data in the form of one or more software 'words' if desired. Such words are used to furnish information to a processor or other functionality that has the ability to "read" the communicated word or words. Hardware lines 210, if utilized, can transmit signals, such as a voltage or current level, which signals are used to indicate the property to be communicated.

As would be appreciated by one of ordinary skill in the art after reading this description, in examples of implementations where Communication section 200 and position determination section 202 are implemented on a common chip or chipset, communications between the two "sections" is not necessarily accomplished via a link, as the two sections are not necessarily physically separate. In such examples of implementations, communications may be accomplished, for example, by sharing data in registers accessed by the DSP, communicating over a common bus, or via other intra-chip or intra-chipset means. As further examples, the communication between sections may be made by inter-task communication, and certain data transfers, such as any time or frequency transfers between the communication section 200 and the position-determination section 202.

Example Applications

Before describing the present invention in further detail, it is useful to describe several example applications in which the invention may be implemented. The example applications described herein can either allow the ALCD to determine its position from signals it receives directly from the GPS satellites themselves. Alternatively, these architectures also allow the ALCD to utilize a communication link with the base station to obtain position information from the base station in situations where the GPS signal strength may be to weak for the ALCD to make such a determination on its own.

Figure 3:
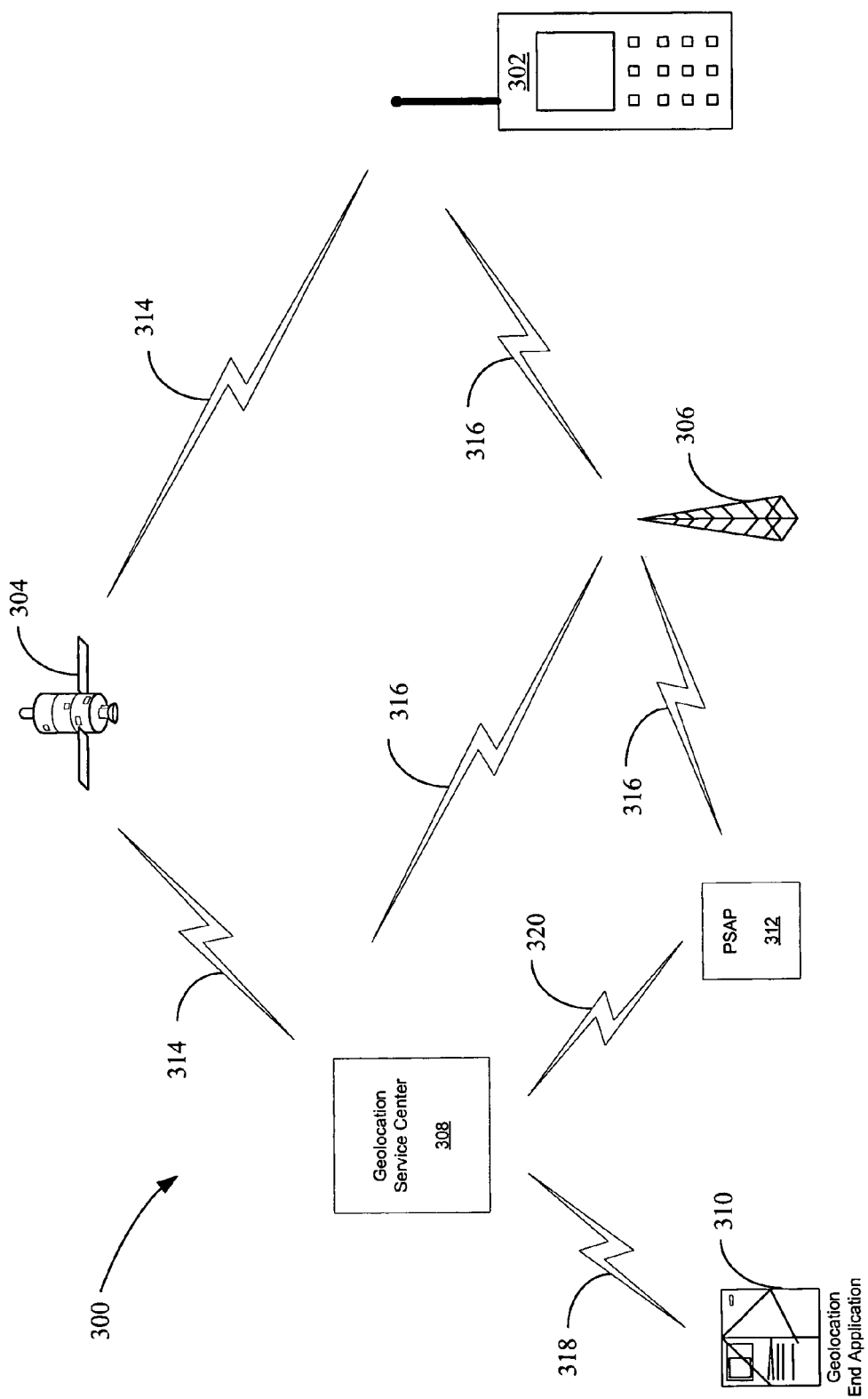
FIG. 3 illustrates an example of an implementation of an architecture for the ALCS shown in FIG. 1.

In FIG. 3, an example of an implementation of an ALCS 300 architecture is shown. The ALCS 300 architecture in this example of an implementation utilizes GPS technology in support of various implementations of the ALCD 302 for the implementation of E911 and geolocation services. By taking advantage of low cost, low power, high performance and high accuracy GPS receivers and the wireless network communication services, the ALCS 300 can provide highly reliable and economical solutions to the ALCD 302. The ALCS 300 can be implemented to support various types of geolocation services including a GPS-standalone mode, a GPS-autonomous mode, a GPS-network-aided mode, a GPS-network-centric mode, a reverse-aiding mode, a network-based and an augmented-aiding mode, each of which are described in more detail in the related-application documents incorporated herein by reference. The ALCS 300 can also accommodate a wide range of wireless communication technologies including, for example, CDMA, TDMA, AMP, and even pager systems.

In FIG. 3, an example of an implementation of the ALCS system 300 may include a GPS satellite 304 (which is illustrative of the constellation of GPS satellites 304 that are in Earth's orbit), the ALCD 302 that includes a GPS receiver, a base station 306, a geolocation (server) service center 308, a geolocation end application 310, and a Public Safety Answering Point ("PSAP") 312.

In an example of operation, the GPS satellite 304 transmits spread spectrum signals 314 that are received at the ALCD 302 and the geolocation server 308. For ease of illustrative purposes, a single GPS satellite 304 is illustrated in FIG. 3. However, other GPS satellites also are transmitting signals that can be received by the ALCD 302 and the geolocation server 308, depending on their respective positions. If the ALCD 302 receives strong enough signals 314 from one or more GPS satellites 304, the GPS receiver in the ALCD 302 may compute the position of the ALCD 302 in a typical fashion of a conventional GPS system, or through use of the present invention where signals 314 are not strong enough to be received by a conventional GPS receiver.

Alternatively, in some examples of implementations, if the ALCD 302 is not able to receive strong enough signals 314, or is not able to receive signals 314 from enough GPS satellites 304 to autonomously compute the position of the ALCD 302, it may still be able to communicate with base station 306 via signal path 316. In this example, the base station 306 may communicate information, via signals 316, to the ALCD 302 to allow the ALCD 302 to compute its location. Alternatively, the base station 306 may communicate information from the ALCD 302 to the geolocation server 308 to allow the geolocation server 308 to compute the position of the ALCD 302. If the base station 306 is transferring information to the ALCD 302 to allow the ALCD 302 to compute its position, the process is known as "wireless-aided GPS," whereas when the base station 306 transfers information from the ALCD 302 to the geolocation server 308 for the geolocation server 308 to compute the position of the ALCD 302, it is known as "network-centric GPS."

The geolocation service center (i.e., the geolocation server) 308 also communicates with the geolocation application 310, via signals 318, and with PSAP 312 via signals 320. These signals 318 and 320 may either be via wireless links or may be through the land-line telephone network or other wire-based networks.

The ALCS 300 may include two major service systems that include the ALCD 302 with the GPS receiver and the geolocation server 308 having geolocation software modules. In addition, in this example of implementation, there can be two types of supporting systems: the base station ("BS") 306 infrastructure, which provides the network information transfer mechanism, and the PSAP 312 or the geolocation end application 310 system, which may initiate the geolocation network services.

The ALCD 302 may include a typical communication section that performs the CP functions, and a position-determination section for position computation, pseudorange measurement, and other GPS functions performed at the ALCD 302. A serial communication link, or other communications link, performs the communications between the communication section and the position-determination section and a collection of hardware lines may be utilized to transmit signals between the two sections.

Figure 4:
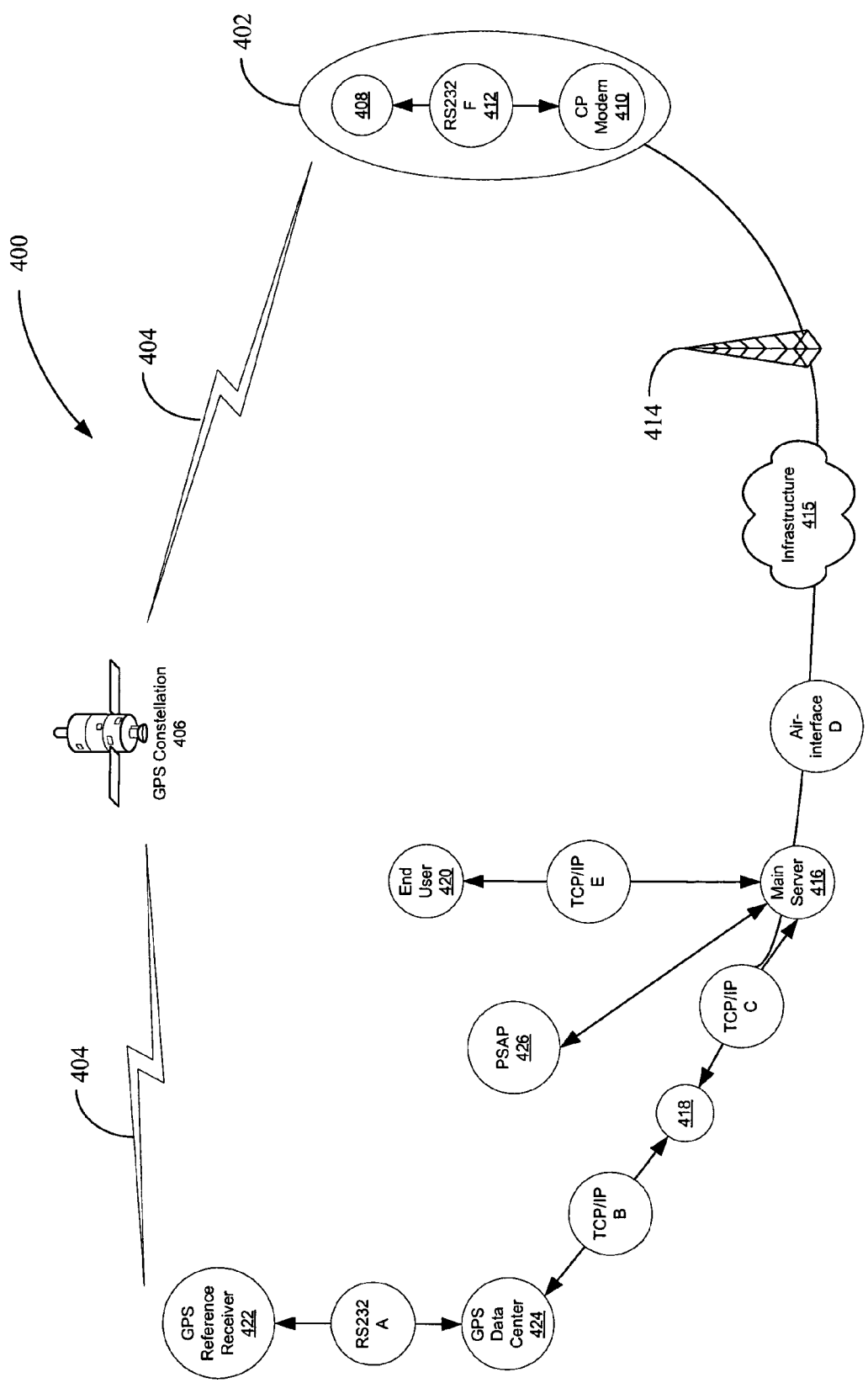
FIG. 4 illustrates another example of an implementation of an architecture for the ALCS shown in FIG. 1.

FIG. 4 illustrates another example of an implementation of an end-to-end system of an example ALCS 400 with which the present invention can be implemented. The ALCS 400 illustrated in FIG. 4 shows the ALCD 402 receiving GPS signals 404 from GPS satellite constellation 406. The ALCD 402 includes a position-determination section 408 having a GPS receiver client (not shown) and communication section 410 having a CP section (not shown), connected by, for example, an RS232 data link 412. The communication section 410 communicates with base station 414, which communicates with a main server 416 via the cellular and/or cellular/land-based telephone network 415. The main server 416 communicates with the geolocation server 418 and the application 420 via land-based or wireless networks, typically using TCP/IP protocols.

The GPS signals 404 can also be received by a series of reference receivers 422 that compute the position of the reference receivers 422 and extract data from the GPS signals 404. The extracted data such as time, Doppler, frequency, etc. is sent to a GPS data center 424, for all of the GPS satellites in the GPS constellation 406. When needed, the geolocation server 418 extracts data from the GPS data center 424 for use by the ALCD 402, and transmits the data to the ALCD 402 or the application 420. The main server 416 may also interface to the PSAP 426 if desired, and the main server 416 and the geolocation server 418 may be co-located if desired or necessary.

Figure 5:
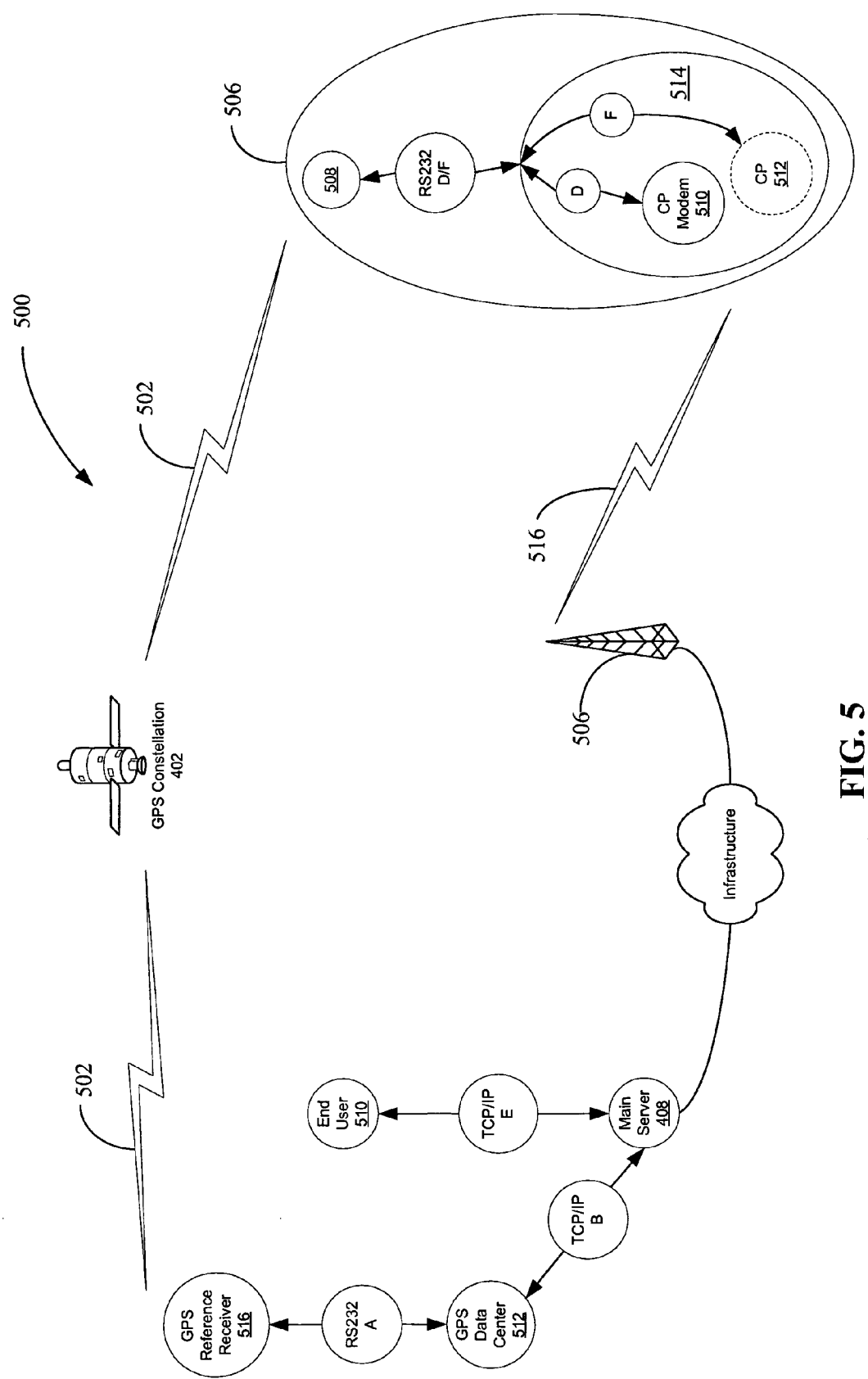
FIG. 5 illustrates yet another example of an implementation of an architecture for the ALCS shown in FIG. 1.

FIG. 5 illustrates another example of an application for an ALCS. Referring now to FIG. 5, an ALCS 500 is configured to receive GPS signals 502 from GPS constellation 504. The ALCD 506 may include position-determination section 508 having a GPS receiver, also called the client, a server 510, and a CP section 512. The server 510 and CP 512 may be included in the communication section 514. In the ALCS 500, server 510 is usually known as a "thin server," since it will not have the same capabilities of server (i.e., the communication section 410) described in FIG. 4. The ALCS 500 utilizes GPS reference receiver 516 to also receive signals 502 from GPS constellation 504, and stores the GPS data in data center 518. This information is transmitted to main server 520 when requested by application 522, or by the ALCD 506, which uses server 510 to transmit the data back and forth between the CP section 512 and client 508. The ALCS 500 allows for some aiding data, such as ephemeris, to be stored in the ALCD 506 at the server 510 and then provided to the client 508 on demand.

As would be apparent to one of ordinary skill in the art after reading this description, the present invention may be implemented with other wireless systems or wireless communication devices. Depending on a number of factors including the wireless network being used such as cellular, PCS, two-way paging, Specialized Mobile Radio ("SMR"), Short Messaging Service ("SMS"), etc. the physical implementation of the ALCS may vary from that shown in FIGS. 3, 4 and 5. FIGS. 3, 4 and 5 are provided for illustrative purposes only, and are not meant to limit the application of the present invention to the applications described therein. As discussed, the example applications described in FIGS. 3, 4 and 5 can allow the ALCD to determine its position from signals it receives directly from the GPS satellites themselves, or via a communication link with the base station in situations where the GPS signal strength may be too weak for the ALCD to make such a determination on its own. Because the present invention allows the ALCD to determine its position from signals it receives directly from the GPS satellites themselves in situations where the signal strength is weaker than otherwise desired, in these examples of implementations, reliance on the communication link with the base station for position determination can be minimized or even eliminated. As such, the invention may, in some examples of implementations, allow an ALCS to be implemented without the link via the base station for GPS data. Further, the present invention may be utilized with hardwired systems such as the landline telephone system, local area networks, etc., without departing from the scope of the present invention.

Reference Oscillator Frequency Correction

Having introduced the invention and presented a few examples of applications, it is useful to now discuss the present invention in greater detail. The present invention is directed toward a system and method for allowing improved Time to First Fix (TTFF) and Availability with reduced errors from a reference oscillator, thereby allowing a reference oscillator of lower cost and quality to be used with little or no reduction in performance of the GPS receiver function. In one example of an implementation, this is accomplished by obtaining estimates of a frequency error of a local reference frequency oscillator, using these estimates to predict frequency error in the future, and using such predictions to allow the GPS receiver to track the phase of an incoming GPS signal. As a result, longer integration times are possible as the receiver can better maintain coherence with the incoming signal and, therefore, the receiver has a greater ability to acquire weak signals. The estimates of frequency error can be obtained using a radio received signal to obtain frequency error measurements that have some favorable statistical noise characteristics as compared to those estimates available within the GPS receiver portion. Alternatively, estimates of frequency error can be obtained using measurements or data that may indicate a drift in the reference frequency. For example, a temperature sensor may be used to estimate a temperature-induced offset based on the ambient temperature of the device.

A filtering system can be utilized with the present invention to provide a net frequency estimate having the best (or at least better) noise characteristics of both radio and GPS receive signals and the original reference source. In one example of an implementation, the filtering system is an adaptive filter, capable of "self" adjustment in that it can adapt its characteristics based on the input signals it receives. As a result, the adaptive filter can be advantageous as its filter characteristics can change in response to varying signal conditions.

In application, the invention can be utilized to reduce, or at least compensate for, the effects of temperature or other factors that may induce variations of the reference oscillator frequency. For example, consider an application where the GPS receiver is integrated with the functionality of a cellular or other mobile telephone. When the cellular telephone user wishes to make an emergency 911 call, it is possible that his or her cellular telephone was previously powered off, perhaps to prolong battery life or for other reasons. When the cellular telephone user wishes to make the emergency 911 call, he or she must first power on the cellular telephone, and thus apply power to the telephones circuitry, including the transmitter. The transmit process, and powering on the componentry in general, generates some heat, which builds up inside the cellular telephone. This causes the temperature of the reference oscillator to ramp up, which, in turn, causes the reference frequency to accelerate. As a result, the reference frequency used to get a lock on the GPS satellite signal is off by a certain amount, which is referred to as frequency error. Additionally, this frequency error can change over time, for example, as temperature increases or decreases or as other factors change. This frequency error makes it more difficult for the GPS receiver to get a position fix in a timely manner.

The invention determines the frequency error and its drift rate, which can be discussed in terms of a phase acceleration (or deceleration), and uses this characterization data to allow integration of the incoming GPS signal to occur over a longer period of time while maintaining coherence with the incoming signal. As a result, this effectively provides a higher sensitivity GPS receiver, allowing detection and measurement of lower signal levels to be achieved.

The inclusion of the filtering process allows higher order characterization data to be determined such as, for example, phase acceleration and phase jerk (i.e., rapid acceleration changes). Utilizing these higher-order characterization data allow the receiver to inject a drift rate correction factor into the correction algorithm during an interval of processing time. In one example of an implementation, the characterization data, including the higher-order characterization data can be projected in time to allow application of such a correction factor to a future processing interval. Additionally, in one example of an implementation, the filtering system can also provide the ability to combine (preferably optimally) measurements of varying measurement quality and varying sampling intervals. Such higher-order characteristics may be utilized in either a hardware or software implementation.

Figure 6:
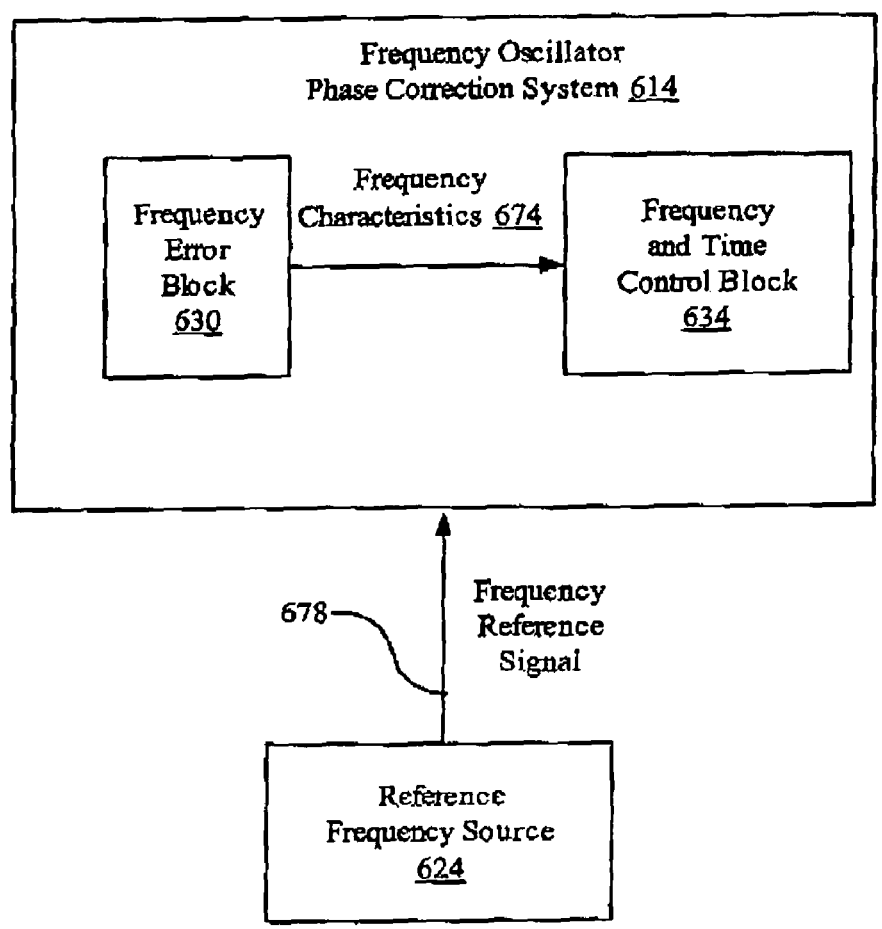
FIG. 6 is a functional block diagram illustrating the functionality of the frequency phase correction system in accordance with one example of an implementation of the invention.

FIG. 6 is a functional block diagram illustrating the functionality of the frequency phase correction system in accordance with one example of an implementation of the invention. Referring now to FIG. 6, in the illustrated example of an implementation, a frequency oscillator phase correction system 614 includes a frequency error block 630 and a frequency and time control block 634. Frequency error block 630 and frequency and time control block 634 are implemented to determine frequency characteristics of a frequency reference signal 678 provided to the GPS receiver, usually by a local frequency reference source 624. The frequency characteristics can then be applied by the GPS receiver, for example in an ALCD, to reduce or compensate for the effects of temperature or other factors that may cause variations in the reference oscillator frequency.

Figure 7:
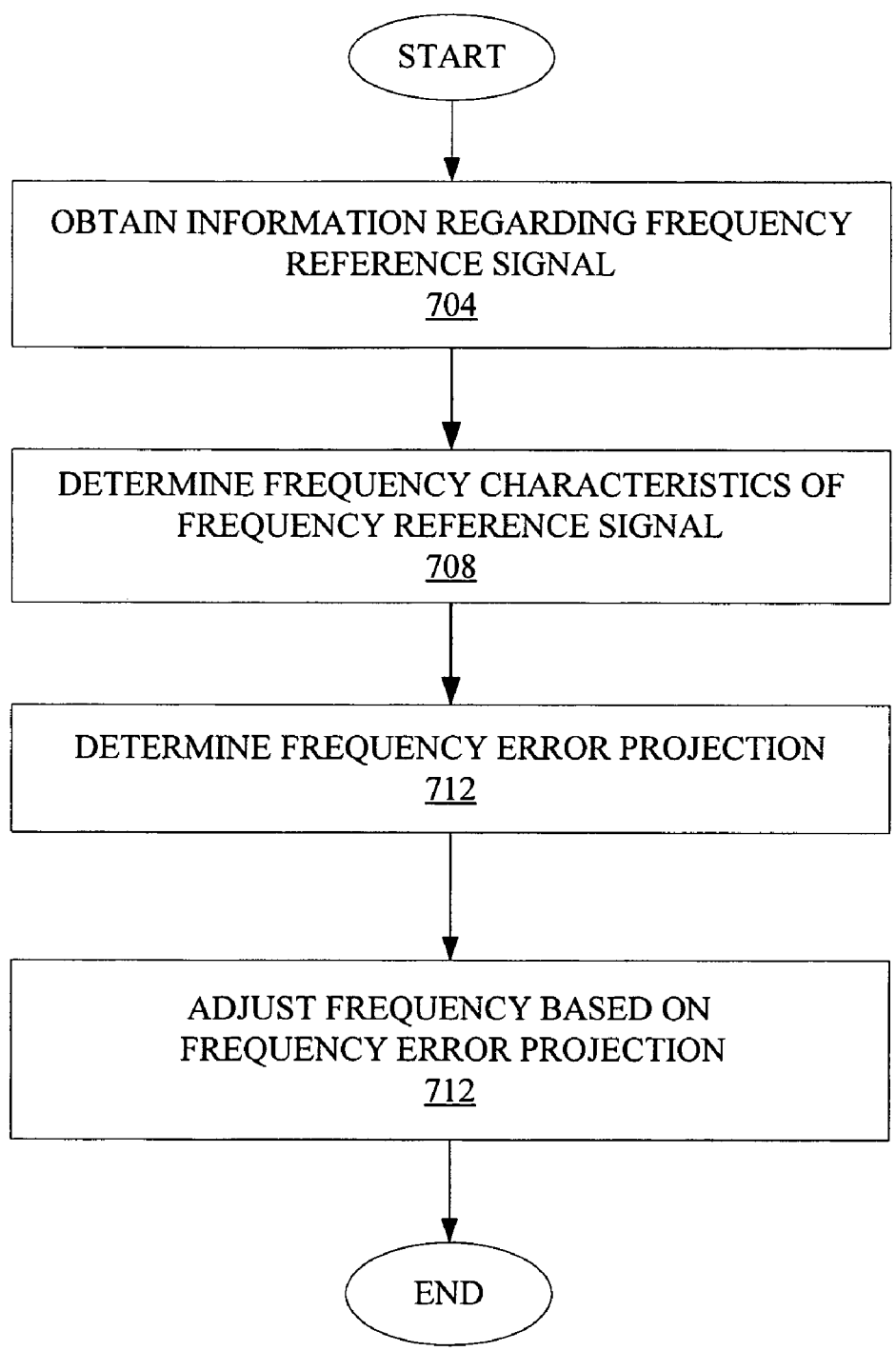
FIG. 7 is an operational flow diagram illustrating the operation of the frequency phase correction system in accordance with one example of an implementation of the invention.

FIG. 7 is an operational flow diagram illustrating the operation of the frequency phase correction system in accordance with one example of an implementation of the invention. Referring now to FIGS. 6 and 7, in a step 704, frequency error block 630 determines information about the frequency reference signal 678 to be used by a position determination system for receiving GPS signals. This information can include, for example, an estimate of the frequency error of frequency reference signal 678 at a given time. The estimate of the frequency error of frequency reference signal 678 can be determined by receiving this information from a separate or external source (e.g., external to frequency error block 630) or by computing this information, wherein the computation is performed in part or in whole by frequency error block 630. Computations, whether internal or external to frequency error block 630, can be made through various means, including, for example, utilizing a temperature sensor to estimate frequency error based on the measured ambient temperature in which the device is operating.

In another example of an implementation, the estimate of frequency error may be obtained from the communications portion of the ALCD in which the position determination system is operating. In this example of an implementation, for example, a phase-locked loop, automatic frequency control circuitry, or other technology may be operating in a cellular telephone portion of the ALCD to determine the difference between the received cellular communication signal and the frequency reference signal 678.

Information about frequency reference signal 678 can also include information regarding the signal quality of a signal received by the ALCD. For example, where the ALCD is a cellular telephone or like device, this additional information can include a measure of the signal quality of the received communication signal of the ALCD. Frequency error block 630 can be tuned based on the expected noise in the frequency estimates, which is a function of the signal quality received by the ALCD (e.g., the cellular telephone's signal quality).

In one example of an implementation, estimates of frequency are received by or determined by frequency error block 630 at periodic intervals, such as, for example, every 45 milliseconds, although other time intervals may be used. A received frequency estimate is compared to the previous estimate, and a difference measurement is taken. The difference measurement is used to make an estimate of the phase acceleration of the frequency error.

In a step 708, frequency error block 630 uses the information obtained regarding error in frequency reference signal 678 to determine appropriate frequency characteristics 674 that will be used to correlate the position determination system with received GPS signals. In one example of an implementation, frequency error block 630 is implemented as an adaptive filter, although other implementations are possible. More particularly, in one example of an implementation, frequency error block 630 is implemented as a two-state Kalman filter, which can track phase acceleration and phase jerk over time. Current filtered estimates of phase acceleration and phase jerk can then be used by the Kalman filter to predict phase acceleration at times in the future.

Utilizing the Kalman filter or other alternative functionality, the frequency characteristics that are determined in step 708 can include, for example, characteristics such as frequency error (i.e., error expressed in parts-per-billion or other units), the rate of change of the frequency error (i.e., error parts-per-billion/second). Additionally, to allow the system to maintain better coherence during signal acquisition, it may also be desirable to obtain higher order frequency characteristics such as frequency acceleration (i.e., error parts-per-billion/second$^2$) and frequency jerk (i.e., the rate of change of acceleration, or error parts-per-billion/second$^3$).

Frequency error block 630 can also be utilized to provide filtering of the input that comes from the communications portion of the ALCD. This may be desirable in certain applications such as, for example, cellular telephones where the baseband processing operates at a relatively high bandwidth (higher than the GPS receiver system) of a few hundred hertz. In such applications, frequency error block 630 can be used to filter broadband noise from the incoming signal. Although illustrated as a separate block, the functionality of frequency error block 630 may alternatively be combined into existing filters in the GPS receiver of the ALCD. As an additional alternative, the functionality of frequency error block 630 may be combined into the processing functions of the ALCD (e.g., the cellular telephone's DSP).

In a step 712, given the frequency characteristics determined in step 708, the frequency error is projected into the future. Such projections can be made via various algorithms operating within (or even outside of) frequency oscillator phase correction system 614. However, in one example of an implementation, the projections are made using frequency error block 630, which, as stated, in this example of an implementation is implemented as a Kalman filter or the like. A Kalman filter, commonly known in various signal processing applications, operates using a set of mathematical algorithms to provide a computational set of algorithms for estimating the state of a process, often in a way that minimizes the mean of the squared error. The Kalman filter can provide estimations of past, present, and even future states. In operation, the Kalman filter estimates a process by using a form of feedback control. More particularly, the filter estimates the process state at a given point in time and then obtains feedback from measurements taken and uses this feedback in the estimation process. As a result, the Kalman filter can typically operate in two modes: the time update mode and the measurement update mode. The time update mode utilizes time update algorithms that are capable of projecting the current state and error covariance estimates forward in time to obtain an a priori estimate for a next time step. The measurement update mode utilizes measurement update algorithms that are capable of utilizing the feedback measurements and incorporating a given measurement into the a priori estimate to obtain an improved a posteriori estimate. Therefore, the time update algorithms can be referred to as predictor algorithms, while the measurement update algorithms can be thought of as corrector algorithms.

In operation, the Kalman filter typically operates in a cyclical manner. The time update algorithms are used to estimate the process that is going to occur at a future time, and the measurement update algorithms measure the actual performance and adjust the projected estimates as a result of the actual measurement. As a result of this iterative process, prediction estimates can generally be obtained more accurately than would otherwise be obtained without the feedback loop.

With the frequency characteristics of reference signal determined, in a step 718, the measurements and predictions determined in step 712 can now be used to allow the GPS receiver to adjust the operating frequency of its local oscillator on an ongoing basis (either continuously or at intervals) to obtain better phase coherence with the GPS signals. In the illustrated example of an implementation, this can be accomplished with frequency and time control block 634 or in other blocks within the ALCD. For example, in another example of an implementation, the frequency characteristics are stored in one or more registers or other locations and utilized by a processor (such as, for example, a DSP of a cellular telephone or other ALCD) to perform the frequency projections and provide an indication to the receiver of the frequency adjustment.

Figure 8:
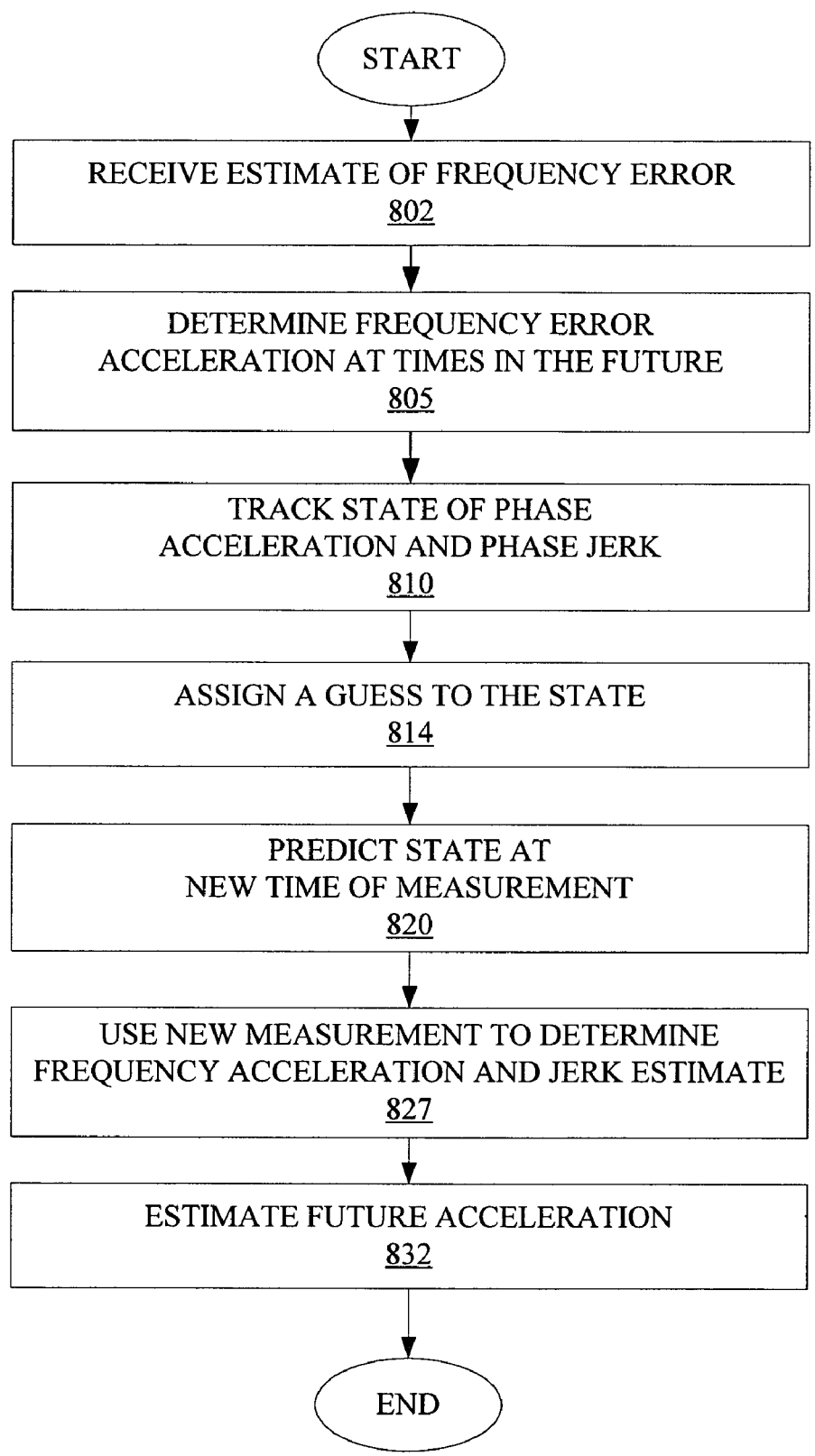
FIG. 8 is an operational flow diagram illustrating a process for estimating a value for the frequency acceleration at a future point in time according to one example of an implementation of the invention.

FIG. 8 is an operational flow diagram illustrating a process for estimating a value for the frequency acceleration at a future point in time according to one example of an implementation of the invention. Referring now to FIG. 8, in a step 802, the system receives a measurement or estimate of the fractional frequency error, $\Delta f/f_0$. Preferably, the measurement of the fractional frequency error, $\Delta f/f_0$ is received at given time intervals, i.e., once every $\Delta t$ seconds. However, in practice, the uncertainty associated with a given measurement may actually be much larger than the error of the difference of subsequent measurements. Thus, in one example of an implementation, these measurements are considered as the receiver clock acceleration, rather than receiver clock frequency. More particularly, in this example of an implementation, the system utilizes the difference of subsequent measurements and interprets these as an acceleration measurement.

In a step 805, the system predicts the acceleration of the frequency error at determined time intervals in the future. To enable the system to predict the acceleration at times in the future, in one example of an implementation the system is implemented to model the acceleration and jerk, and can be implemented to ignore any higher-order terms if desired (which is the example of an implementation described herein). The clock acceleration, a, can be illustrated by the expression, $$a = x_1 t + x_2$$

in units of, for example, parts-per-billion/second (ppb/s), and where $x_1$ is the frequency jerk and $x_2$ is the frequency acceleration, at a given time t=0.

Although time t=0 can be fixed as being some time in the past, in one example of an implementation, t=0 is defined as the time of the most recently received frequency measurement. Thus, in this example of an implementation, when a new measurement of a is received, this new measurement is defined as time t=0, and the time of the previous measurement is described as t=−$\Delta$t, and so on. Therefore, in this example of an implementation, to estimate a at a point in the future, say, at a time 200 milliseconds (ms) after the previous measurement, this is referred to as time t=200 ms.

As discussed above, in one example of an implementation, the system is implemented using a Kalman filter for frequency error block 630. In a step 810, the Kalman filter tracks a state that can be illustrated by the expression, $$x = [x_1 \; x_2]^T$$

and the model that can be used for the propagation of the state through time is, $$x_k = A x_{k-1} + W$$

where A is given by, $$A = \begin{bmatrix} 1 & 0 \\ \Delta t & 1 \end{bmatrix}$$

and w is the process noise, distributed N(0,Q). In one example of an implementation, the filter is tuned by adjusting the elements of the process noise covariance matrix, Q.

The received measurements of a will be denoted z, and the measurement model is, $$z_k = H x_k + v_k$$

where H is given by, $$H = [0 \; 1]$$

and v is the process noise, distributed, N(0,R). R is the variance of the received measurements of a. For example, R=(2 ppb/s)$^2$.

The matrix P gives the covariance of the state estimate. In one example of an implementation, in a step 814, a guess is initially assigned to the state, and P is set to reflect the confidence of the assigned guess. For example, $$x_0 = [0 \; 0]^T$$

$$P_0 = \begin{bmatrix} \sigma_{x_1}^2 & 0 \\ 0 & \sigma_{x_2}^2 \end{bmatrix}$$

Where here, $\sigma_{x_1}^2$ and $\sigma_{x_2}^2$ are the initial uncertainties regarding the jerk and acceleration.

Therefore, in a step 820, the system utilizes measurements received to predict the state at the time of the new measurement. This can be done prior to the new measurement being performed. In one example of an implementation, this prediction is given by the expression, $$\hat{x}_k^- = A \hat{x}_{k-1}$$

$$P_k^- = A P_{k-1} A^T + Q$$

In a step 827, the new measurement, $z_k$, is added in to the algorithm as illustrated in the following expression, $$K_k = P_k^- H^T (H P_k^- H^T + R)^{-1} = \begin{bmatrix} P_{k,12}^- \\ P_{k,22}^- \end{bmatrix} \frac{1}{P_{k,22}^- + R}$$

$$\hat{x}_k = \hat{x}_k^- + K_k(z_k - H\hat{x}_k^-) = \hat{x}_k^- + K_k(z_k - \hat{x}_{k,2}^-)$$

$$P_k = (I - K_k H) P_k^-$$

which yields a current estimate for the frequency jerk $x_1$, and for the frequency acceleration $x_2$.

In a step 832, the acceleration at some time in the future is estimated as, $$\hat{a}(T) = \hat{x}_1 t + \hat{x}_2$$

The process of predicting the acceleration of the frequency can be done iteratively such that the estimation of this value for given points in the future are computed on an ongoing basis.

Figure 9:
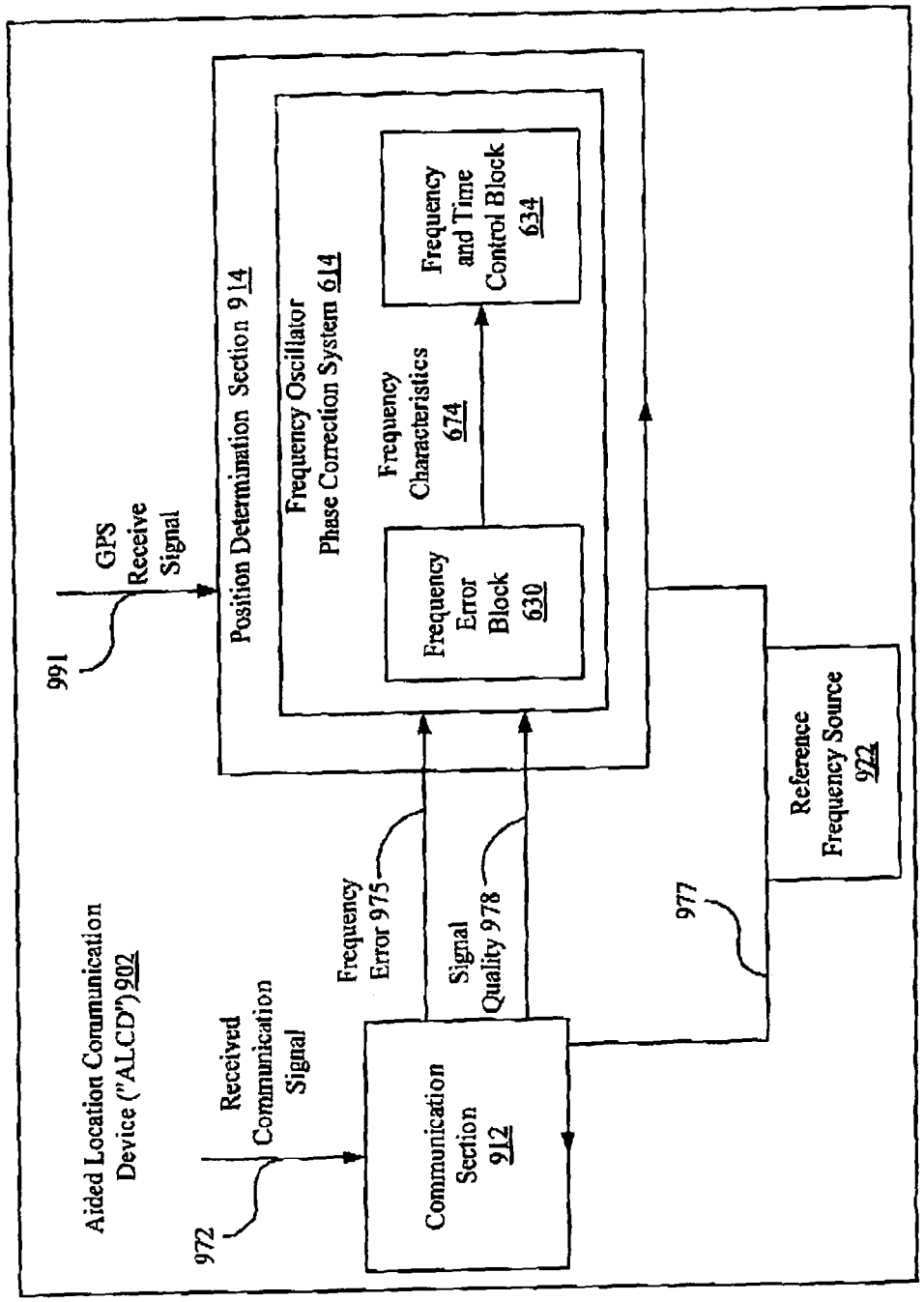
FIG. 9 is a functional block diagram illustrating the functionality of a frequency phase correction system in an example environment of a simple ALCD.

FIG. 9 is a functional block diagram illustrating the functionality of the frequency oscillator phase correction system in an example environment of a simple ALCD. Referring now to FIG. 9, an example ALCD 902 is illustrated as having a communication section 912 and a position determination section 914. As with the example applications described above, with reference to FIGS. 3, 4 and 5, communication section 912 and position determination section 914 can be implemented using separate chips or chipsets, or, alternatively, their functionality can be combined or shared on a common chip or across multiple chips in a chipset. For example, in one possible application where ALCD 902 is a cellular telephone with E911 capability, the foundational component of such a cellular telephone is a DSP. This DSP is typically tasked with performing functions such as, for example, modulating and demodulating the data stream, coding and decoding the data stream for error detection and correction, encrypting and decrypting for security and privacy purposes, and compressing and decompressing the speech signal. In some applications, ASIC hardware (application specific integrated circuit) is included in the chipset and operate under the control of the DSP. These ASICs can be used to perform functions such as, for example, processing, modulation and demodulation of the signal, and are typically found in systems utilizing spread spectrum techniques. Additionally, RF circuitry is added to provide the transmit and receive functions of the cellular telephone as well as amplification of the radio signals. Some applications may also include a general purpose processor to handle other functions of the cellular telephone as well. For example, in some applications the general purpose microprocessor supports the user interface of the handset and handles the upper layers of the communications protocol stack. Thus, in various examples of implementations, the functionality of the position determination section 914 can be implemented using additional processors, ASICs, or other devices, which are tied to the communication section 912 using various hardware or software interconnect techniques. Alternatively, the position determination section 914 can be implemented by incorporating additional functionality into the DSP and other componentry of the communication section 912. For example, in this latter example of an implementation, algorithms used to determine position information would be included to operate in the chip or chipset provided for communication section 912. Thus, although communication section 912 and position determination section 914 are illustrated as separate functional blocks, in implementation, they may comprise common physical componentry.

Position-determination section 914 includes a GPS receiver for receiving the GPS signal transmissions 991 from a GPS satellite in the GPS constellation. Although not illustrated, position-determination section 914 may also include a non-GPS receiver capable or receiving non-GPS location aiding information as in the example applications described above with reference to FIGS. 3, 4 and 5. Position-determination section 914 performs the position computation functions for the ALCD 902 to enable ALCD 902 to determine, for example, a location or position as well as optionally rate and direction of travel.

In the example of an implementation illustrated in FIG. 9, position determination section includes a frequency error block 630 and a frequency and time control block 634. In the example of an implementation illustrated in FIG. 9, frequency error block 630 and a frequency and time control block 634 can be implemented to operate as described above with reference to FIGS. 6, 7 and 8.

As described above with reference to FIGS. 6 and 7, frequency error block 630 obtains information such as frequency error and signal quality to predict frequency acceleration for a given time in the future. In the example of an implementation illustrated in FIG. 9, frequency error 975 and signal quality 978 are obtained from communication section 912. For example, in one example of an implementation the frequency error 975 may be obtained from the cellular telephone's automatic frequency control (AFC) subsystem, which, for example, can compare the frequency of a reference signal 977 provided by local reference frequency source 922 with an external frequency received via a received communication signal 972. This approach can be implemented where a reference frequency source 922 provides a common frequency reference signal 977 to both communication section 912 and position determination section 914. Although not illustrated, frequency error 975 may be derived independently of communication section. Such an alternative example of an implementation would be particularly useful where, for example, there is not a common frequency reference shared by both communication section 912 and position determination section 914.

In another example of an implementation, commonly known frequency-difference or phase-difference measurement circuits and/or software can be used to determine the frequency error 975. Additionally an AFC or other complex frequency measurement subsystem can, but is not necessarily, utilized to determine the frequency error 975. For example, a temperature sensor can be used to derive a level of error or drift in a frequency reference based on the temperature of the device. In one example of an implementation, frequency error 975 and signal quality 978 are expressed as software words or a data message utilized by a processor (e.g., a DSP) to perform the predictions, although other example of an implementations are possible wherein frequency error 975 and signal quality 978 are expressed as hardware signals rather than software data.

The illustrated example of an implementation includes the use of a signal quality 978, which can be derived using received signal strength, phase noise in the loop or other characteristics that can be used to indicate the quality of the received signal. This signal quality 978 can be used to determine, for example, a level of filtering that may be desirable to be performed by frequency error block 630. In examples of implementations where signal quality 978 is not available or otherwise not utilized, a fixed filter value can be utilized instead of using an adaptive filter. Preferably, in most cellular telephone applications, the filtering performed by frequency error block 630 is utilized for the frequency correction system of the present invention, and would typically not by utilized by the AFC loop of the cellular telephone.

While various preferred and alternative embodiments of the present intention are described herein, it will be apparent to one of ordinary skill in the art after reading this description art that there are various modifications and extensions of the above described technology that may be implemented using these teaching without departing from the spirit and scope of the present invention, the breadth and scope of which shall be defined by following claims.

What is claimed is:

1. A frequency phase correction system for use with a communication device utilizing a reference frequency signal and comprising a communication section and a position determination section configured to determine position information of the communication device based on one or more radio frequency signals received by the position determination section, the frequency reference correction system comprising:
    a frequency error block, including an adaptive filter, configured to estimate a frequency error, a drift rate, and a phase acceleration in the reference frequency signal during a time interval in the future; and
    a frequency and time control block configured to adjust an operating frequency of the reference frequency signal during the time interval by:
    a) adjusting the estimate of the drift rate based on the estimated phase acceleration, and
    b) adjusting the frequency of the reference frequency signal to counteract the adjusted estimated drift rate.

2. The system of claim 1, wherein said frequency error of the reference frequency signal is obtained by estimating a frequency error based on a measured ambient temperature in which a reference frequency oscillator generating the reference frequency signal is operating.

3. A frequency phase correction system for use with a communication device utilizing a reference frequency signal and comprising a communication section and a position determination section configured to determine position information of the communication device based on one or more radio frequency signals received by the position determination section, the frequency reference correction system comprising:
    a frequency error block configured to estimate a frequency error, a drift rate, and a phase acceleration in the reference frequency signal during a time interval in the future; and
    a frequency and time control block configured to adjust an operating frequency of the reference frequency signal during the time interval by:
    a) adjusting the estimate of the drift rate based on the estimated phase acceleration, and
    b) adjusting the frequency of the reference frequency signal to counteract the adjusted estimated drift rate,
    wherein said frequency error of the reference frequency signal is obtained utilizing a phase-locked loop to determine a difference between a received communication signal and the frequency reference signal.

4. A frequency phase correction system for use with a communication device utilizing a reference frequency signal and comprising a communication section and a position determination section configured to determine position information of the communication device based on one or more radio frequency signals received by the position determination section, the frequency reference correction system comprising:
    a frequency error block, configured to estimate a frequency error, a drift rate, and phase acceleration in the reference frequency signal during a time interval in the future; and
    a frequency and time control block configured to adjust an operating frequency of the reference frequency signal during the time interval by:
    a) adjusting the estimate of the drift rate based on the estimated phase acceleration, and
    b) adjusting the frequency of the reference frequency signal to counteract the adjusted estimated drift rate.

5. The system of claim 1, wherein said frequency error of the reference frequency signal is obtained utilizing automatic frequency control circuitry to determine a difference between a received communication signal and the frequency reference signal.

6. The system of claim 1, wherein said reference frequency signal is obtained utilizing a reference frequency generator dedicated to the communication receiver.

7. The system of claim 1, wherein said reference frequency signal is obtained utilizing a reference frequency generator shared by the communication receiver and a second communication receiver.

8. The system of claim 1, wherein said frequency error block is further configured to determine signal quality of a communication signal received by the communication receiver and the adaptive filter is configured to filter the communication signal and, based on the determined signal quality of the communication signal, to adjust a level of filtering applied to the communication signal by the adaptive filter.

9. The system of claim 8, wherein said frequency error block is configured to utilize said signal quality information to refine the estimated frequency error and drift rate.

10. The system of claim 1, wherein said frequency error block is configured to determine frequency error at periodic intervals.

11. The system of claim 1, wherein said frequency error block configured to determine a frequency error of the reference frequency signal is configured to receive frequency error information from a source external to the frequency error block.

12. The system of claim 1, wherein said frequency error block configured to determine a frequency error of the reference frequency signal is configured to compute, at least partially, the frequency error of the reference frequency signal.

13. The system of claim 1, wherein said frequency error block configured to determine a frequency error of the reference frequency signal is configured to compare a determined frequency estimate to a previous frequency estimate, and determine a difference between the determined frequency estimate and the previous frequency estimate.

14. The system of claim 1, wherein said frequency error block is implemented as a Kalman filter.

15. The system of claim 1, wherein said frequency error block is further configured to filter broadband noise from an incoming signal.

16. The system of claim 1, wherein said time and frequency block is implemented using a processor.

17. The system of claim 16, wherein said processor is implemented using a digital signal processor.

18. An aided location communication device (ALCD), comprising:
    a reference frequency oscillator providing a reference frequency signal;
    a communication section providing radio frequency communication with one or more communication devices;
    a position determination section configured to determine position information of the ALCD based on one or more received radio frequency signals received by the position determination section; and a frequency phase correction system, including an adaptive filter configured to filter the one or more radio frequency signals received by the position determination section, the frequency phase correction system configured to correlate the reference frequency signal with the one or more adaptively filtered radio frequency signals, wherein the adaptive filter estimates a frequency error, a drift rate, and a phase acceleration in the reference frequency signal during a time interval in the future, and the frequency phase correction system adjusts an operating frequency of the reference frequency signal during the time interval by:

a) adjusting the estimate of the drift rate based on the estimated phase acceleration, and b) adjusting the frequency of the reference frequency signal to counteract the adjusted estimated drift rate.

19. The system of claim 18, wherein said communication section comprises a wireless communication device.

20. The system of claim 19, wherein the wireless communication device is a cellular telephone.

21. The system of claim 18, wherein said position determination section comprises a GPS receiver.

22. The system of claim 18, wherein said frequency phase correction system comprises:

a frequency error block, including the adaptive filter, the frequency error block being configured to determine a frequency error of the reference frequency signal, one or more frequency characteristics of the reference frequency signal, and an estimate of the frequency error in the reference frequency signal at a time in the future; and a frequency and time control block configured to adjust an operating frequency of the reference frequency signal to account for said estimate of the frequency error in reference frequency signal.

23. The system of claim 22, wherein the frequency error of the reference frequency signal is obtained by estimating a frequency error based on the measured ambient temperature in which the reference frequency oscillator is operating.

24. The system of claim 22, wherein the frequency error of the reference frequency signal is obtained utilizing a phase-locked loop to determine a difference between a received communication signal and the frequency reference signal.

25. The system of claim 22, wherein the frequency error of the reference frequency signal is obtained utilizing automatic frequency control circuitry to determine a difference between a received communication signal and the frequency reference signal.

26. The system of claim 22, wherein the frequency characteristics comprise at least one of a rate of change of the frequency error, and frequency jerk.

27. The system of claim 22, wherein the reference frequency signal is obtained utilizing a reference frequency generator dedicated to the position determination section.

28. The system of claim 22, wherein the reference frequency signal is obtained utilizing a reference frequency generator utilized by at least one of the position determination section and the communication section of the ALCD.

29. The system of claim 22, wherein said frequency error block is further configured to determine signal quality of a communication signal received by a communication receiver and the adaptive filter is configured to filter the communication signal and, based on the determined signal quality of the communication signal, to adjust a level of filtering applied to the communication signal by the adaptive filter.

30. The system of claim 29, wherein the signal quality is that of a communication signal received by the communication section of the ALCD.

31. The system of claim 29, wherein the frequency reference correction system is configured to utilize said signal quality information to refine the determined frequency characteristics.

32. The system of claim 22, wherein said frequency error block is configured to determine frequency error at periodic intervals.

33. The system of claim 22, wherein said frequency error block configured to determine a frequency error of the reference frequency signal is configured to receive frequency error information from the communication section of the ALCD.

34. The system of claim 33, wherein the received frequency error information is at least one of a hardware signal and a software word.

35. The system of claim 22, wherein said frequency error block configured to determine a frequency error of the reference frequency signal is configured to compute, at least partially, the frequency error of the reference frequency signal.

36. The system of claim 22, wherein said reference frequency error block configured to determine a frequency error of the reference frequency signal is configured to compare a determined frequency estimate to a previous frequency estimate, and determine a difference between the determined frequency estimate and the previous frequency estimate.

37. The system of claim 22, wherein the adaptive filter of the frequency error block is a Kalman filter.

38. The system of claim 22, wherein the adaptive filter is further configured to filter broadband noise from a received frequency error signal.

39. The system of claim 22, wherein said time and frequency block is implemented using a processor.

40. The system of claim 39, wherein said processor is utilized by at least one of the communication section and the position determination section.

41. The system of claim 39, wherein said processor is a digital signal processor.

42. A method for receiving wireless signals at a communication device utilizing a reference frequency signal and comprising a communication section and a position determination section configured to determine position information of the communication device based on one or more radio frequency signals received by the position determination section, the method comprising:

adaptively filtering the one or more radio frequency signals received by the position determination section;

correlating the reference frequency signal with the one or more adaptively filtered radio frequency signals received by the position determination section to determine a frequency error of the reference frequency signal, determining one or more frequency characteristics of the reference frequency signal, determining an estimate of the frequency error, a drift rate, and a phase acceleration in the reference frequency signal during a time interval in the future; and adjusting an operating frequency of the reference frequency signal during the time interval by:

a) adjusting the estimate of the drift rate based on the estimated phase acceleration, and b) adjusting the frequency of the reference frequency signal to counteract the adjusted estimated drift rate.

43. The method of claim 42, wherein said determining the frequency error of the reference frequency signal comprises estimating a frequency error based on the measured ambient temperature in which a reference frequency oscillator generating the reference frequency signal is operating.

44. The method of claim 42, wherein said determining the frequency error of the reference frequency signal comprises utilizing a phase-locked loop to determine a difference between a received communication signal and the frequency reference signal.

45. The method of claim 42, wherein the frequency characteristics comprise at least one of a rate of change of the frequency error, and frequency jerk.

46. The method of claim 42, wherein said determining the frequency error of the reference frequency signal comprises utilizing automatic frequency control circuitry to determine a difference between a received communication signal and the frequency reference signal.

47. The method of claim 42, further comprising generating the reference frequency signal utilizing a reference frequency generator dedicated to the communication receiver.

48. The method of claim 42, further comprising generating the reference frequency signal utilizing a reference frequency generator shared by the communication receiver and a second communication receiver.

49. The method of claim 42, further comprising determining a signal quality of a communication signal received by the receiver and changing the adaptive filtering of the one or more radio-frequency signals responsive to the determined signal quality.

50. The method of claim 49, further comprising utilizing said signal quality information to refine the determined frequency characteristics.

51. The method of claim 42, wherein said determining the frequency error further comprises determining the frequency error at periodic intervals.

52. The method of claim 42, wherein said determining the frequency error further comprises receiving frequency error information from a source external to the frequency error block.

53. The method of claim 42, wherein said determining the frequency error further comprises computing, at least partially, the frequency error of the reference frequency signal.

54. The method of claim 42, further comprising comparing a determined frequency estimate to a previous frequency estimate, and determining a difference between the determined frequency estimate and the previous frequency estimate.

55. The method of claim 42, further comprising tuning a frequency error block configured to determine the frequency error, said tuning based on expected noise in the frequency estimates.

56. The method of claim 42, further comprising tuning a frequency error block configured to determine the frequency error, said tuning based on signal quality received by the communication device.

57. The method of claim 42, further comprising determining at least one of phase acceleration, frequency acceleration, phase jerk and frequency jerk over time.

58. The method of claim 42, further comprising filtering the frequency reference signal.

59. The method of claim 42, further comprising storing the frequency characteristics in one or more registers or other locations utilized by a processor.

60. The method of claim 42, further comprising determining a signal quality measure using received signal strength, phase noise in the loop or other characteristics that can be used to indicate the quality of the received signal.

61. The method of claim 60, further comprising using said signal quality measure to determine a level of filtering applied in determining the frequency error.

62. A system for receiving wireless signals at a communication device utilizing a reference frequency signal and comprising a communication section and a position determination section configured to determine position information of the communication device based on one or more radio frequency signals received by the position determination section, the system comprising:
    means for adaptively filtering the one or more radio frequency signals received by the position determination section;
    means for correlating the reference frequency signal with the one or more adaptively filtered radio frequency signals received by the position determination section to determine a frequency error of the reference frequency signal;
    means for determining one or more frequency characteristics of the reference frequency signal;
    means for determining an estimate of the frequency error, a drift rate, and a phase acceleration in the reference frequency signal during a time interval in the future; and
    means for adjusting an operating frequency of the reference frequency signal during the time interval by:
    a) adjusting the estimate of the drift rate based on the estimated phase acceleration, and
    b) adjusting the frequency of the reference frequency signal to counteract the adjusted estimated drift rate.

63. The system of claim 62, wherein said means for determining the frequency error of the reference frequency signal comprises means for estimating a frequency error based on the measured ambient temperature in which a reference frequency oscillator generating the reference frequency signal is operating.

64. The system of claim 62, wherein said means for determining the frequency error of the reference frequency signal comprises means for determining a difference between a received communication signal and the frequency reference signal.

65. The system of claim 62, wherein the frequency characteristics comprise at least one of a rate of change of the frequency error, and frequency jerk.

66. The system of claim 62, wherein said means for determining the frequency error of the reference frequency signal comprises means for determining a difference between a received communication signal and the frequency reference signal.

67. The system of claim 62, further comprising means dedicated to the communication receiver for generating the reference frequency signal.

68. The system of claim 62, further comprising means shared by the communication receiver and a second communication receiver for generating the reference frequency signal.

69. The system of claim 62, further comprising means for determining a signal quality of a communication signal received by the receiver and for changing the adaptive filtering of the one or more radio-frequency signals, by the means for adaptively filtering, responsive to the determined signal quality.

70. The system of claim 69, further comprising means for utilizing said signal quality information to refine the determined frequency characteristics.

71. The system of claim 62, wherein said means for determining the frequency error further comprises means for determining the frequency error at periodic intervals.

72. The system of claim 62, wherein said means for determining the frequency error further comprises means for receiving frequency error information from an external source.

73. The system of claim 62, wherein said means for determining the frequency error further comprises means for computing, at least partially, the frequency error of the reference frequency signal.

74. The system of claim 62, further comprising means for comparing a determined frequency estimate to a previous frequency estimate, and for determining a difference between the determined frequency estimate and the previous frequency estimate.

75. The system of claim 62, further comprising means for tuning a frequency error block to determine the frequency error based on expected noise in the frequency estimates.

76. The system of claim 62, further comprising means for tuning a frequency error block to determine the frequency error based on signal quality received by the communication device.

77. The system of claim 62, further comprising means for determining at least one of phase acceleration, frequency acceleration, phase jerk, and frequency jerk over time.

78. The system of claim 62, further comprising means for filtering the frequency reference signal.

79. The system of claim 62, further comprising means for storing the frequency characteristics in one or more registers or other locations utilized by a processor.

80. The system of claim 62, further comprising means for determining a signal quality measure using received signal strength, phase noise in the loop or other characteristics that can be used to indicate the quality of the received signal.

81. The method of claim 80, further comprising means for determining a level of filtering applied based on said signal quality measure.

\* \* \* \* \*